United States Patent [19]
Itoh

[11] Patent Number: 5,872,373
[45] Date of Patent: Feb. 16, 1999

[54] DRAM-CAPACITOR STRUCTURE

[75] Inventor: Masahiro Itoh, Tokyo, Japan

[73] Assignee: Oki Electric Industry Co., Ltd., Tokyo, Japan

[21] Appl. No.: 879,629

[22] Filed: Jun. 20, 1997

[30] Foreign Application Priority Data

Nov. 18, 1996 [JP] Japan ................................ 8-306899

[51] Int. Cl.$^6$ .......................... H01L 27/108; H01L 29/76; H01L 29/94; H01L 31/119
[52] U.S. Cl. ............................................ 257/296; 257/295
[58] Field of Search .................................. 257/295, 296, 257/300, 301, 303–309, 311

[56] References Cited

U.S. PATENT DOCUMENTS

| | | | |
|---|---|---|---|
| 5,126,280 | 6/1992 | Chan et al. ................................ | 257/309 |
| 5,150,279 | 9/1992 | Gonzalez et al. ......................... | 257/296 |
| 5,292,677 | 3/1994 | Dennison ................................. | 257/309 |

FOREIGN PATENT DOCUMENTS 4-294579  10/1992  Japan ..................................... 257/309

Primary Examiner—Stephen Meier
Attorney, Agent, or Firm—Rabin & Champagne P.C.

[57] ABSTRACT

A semiconductor device employable as a capacitor has a conductive pillar arranged in an opening produced in an insulator layer produced on a semiconductor substrate, the conductive pillar being connected with a conductive region of the semiconductor substrate and being surrounded by a dielectric cylinder which is further surrounded by a conductive cylinder which extends onto the surface of the semiconductor substrate, thereby allowing a capacity, regardless of the horizontal area of the semiconductor device. A semiconductor memory cell of the one transistor and one capacitor structure has a capacitor which has a conductive pillar arranged in an opening produced in an insulator layer produced on a semiconductor substrate, the conductive pillar being connected with a conductive region of the semiconductor substrate and being surrounded by a dielectric cylinder which is further surrounded by a conductive cylinder which extends onto the surface of the semiconductor substrate, whereby a large magnitude of integration is readily realized.

4 Claims, 17 Drawing Sheets

F I G. 1 3
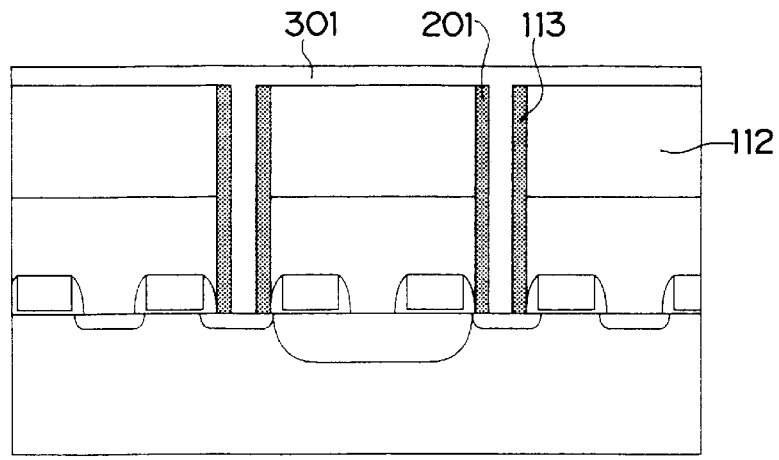
F I G. 1 4
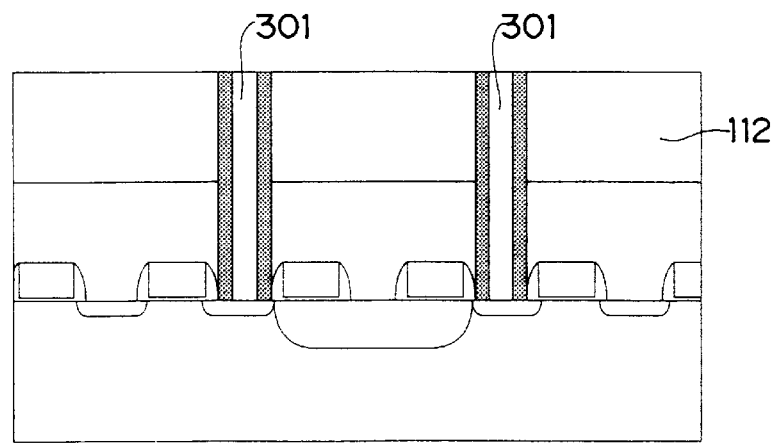
F I G. 1 5
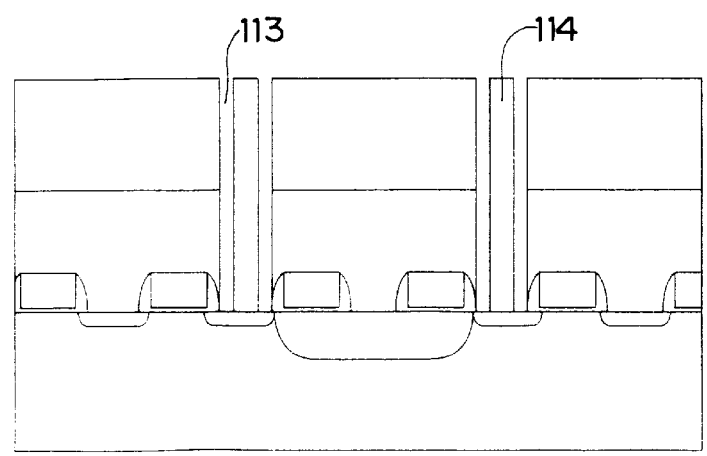

F I G. 2 1
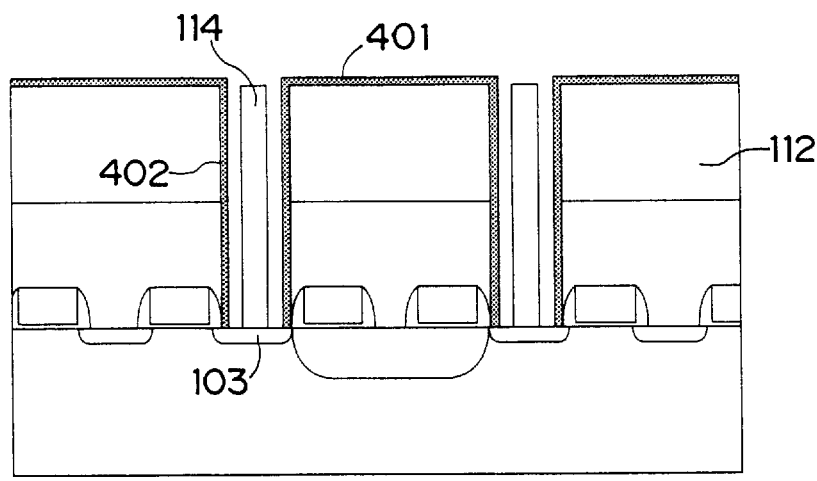
F I G. 2 2
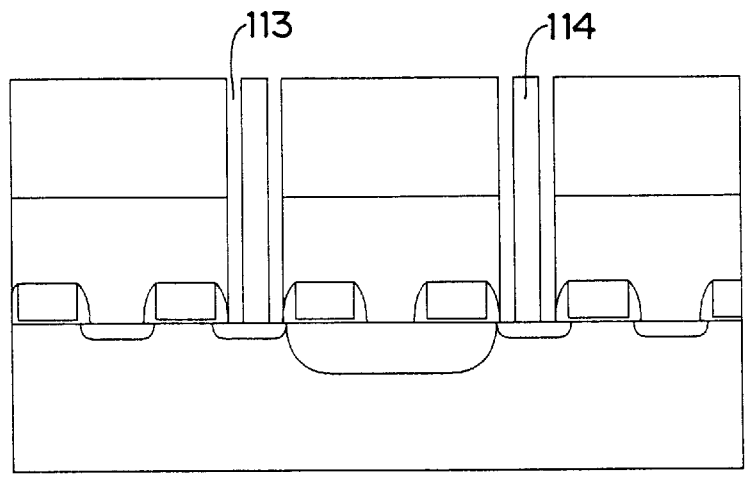

F I G. 2 8
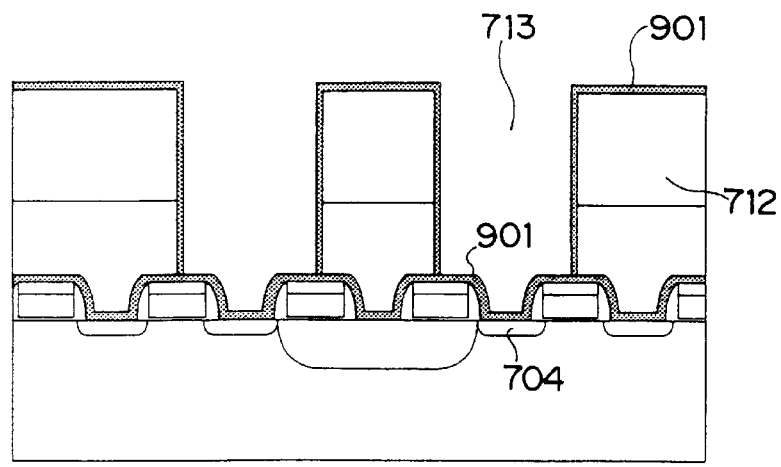
F I G. 2 9
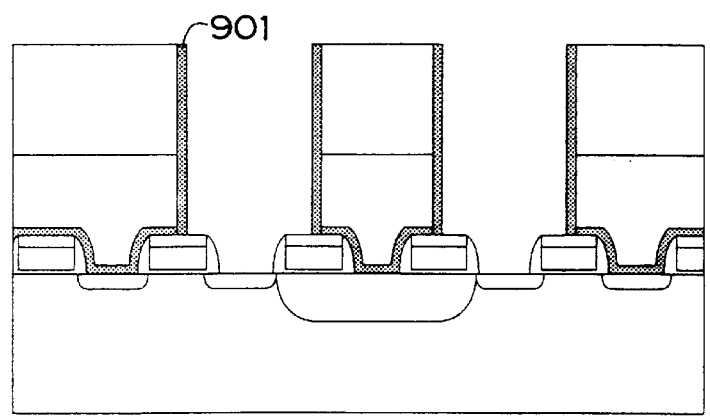
F I G. 3 0
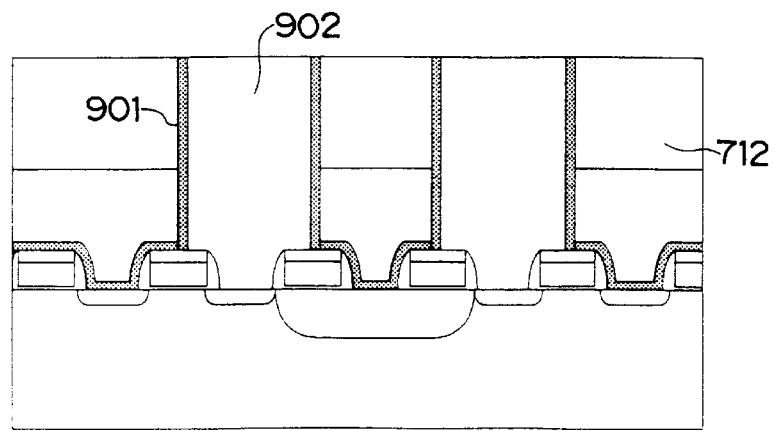

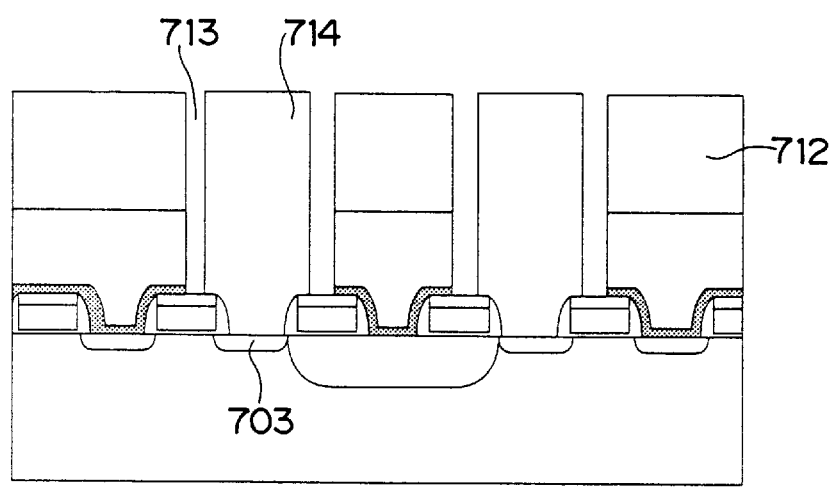
F I G. 3 1

F I G. 3 4
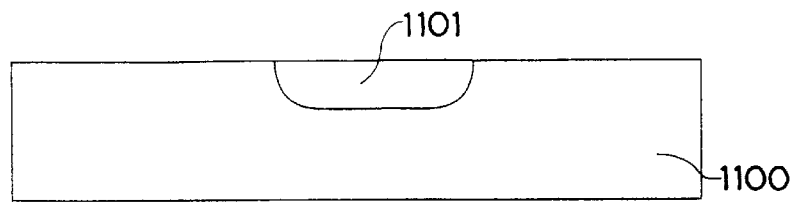
F I G. 3 5
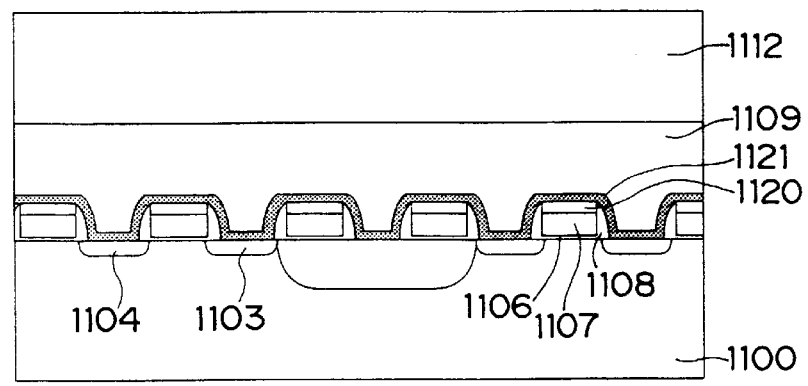
F I G. 3 6
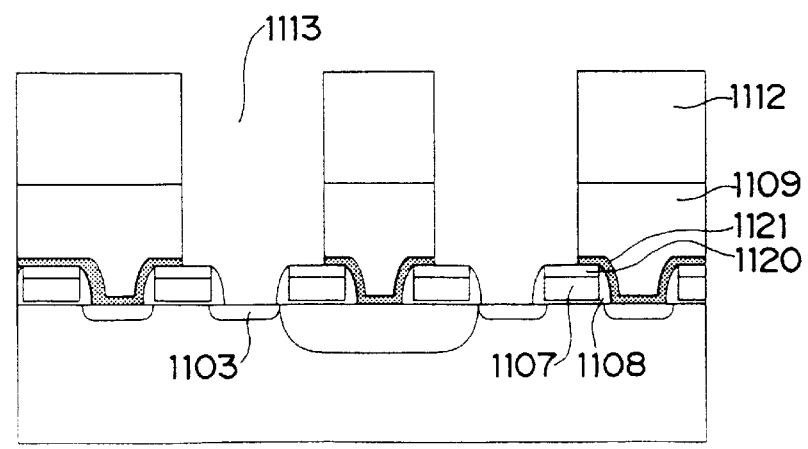

F I G. 3 7
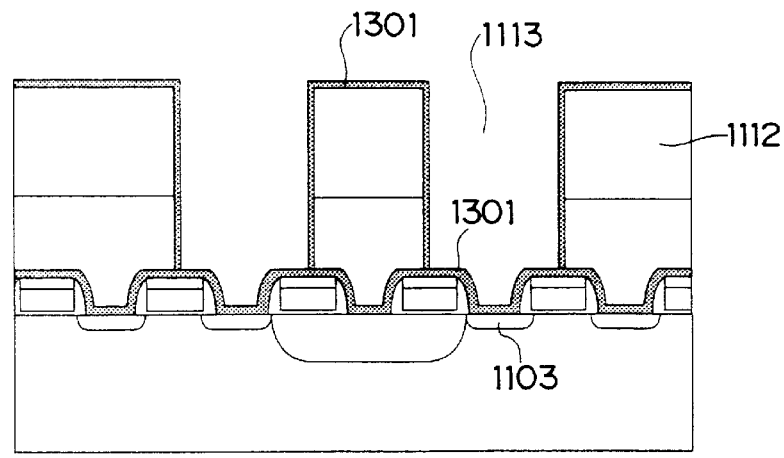
F I G. 3 8
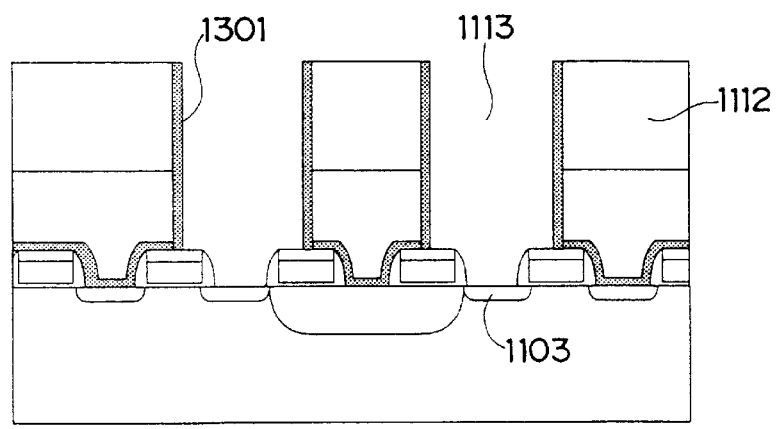
F I G. 3 9
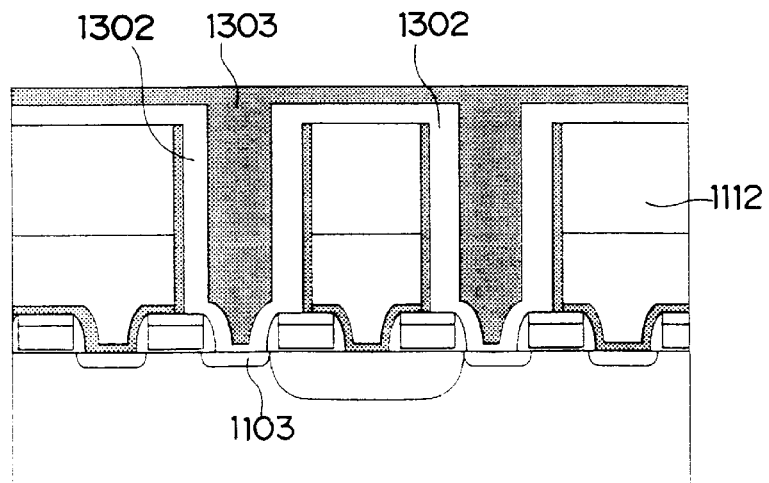

F I G. 4 0
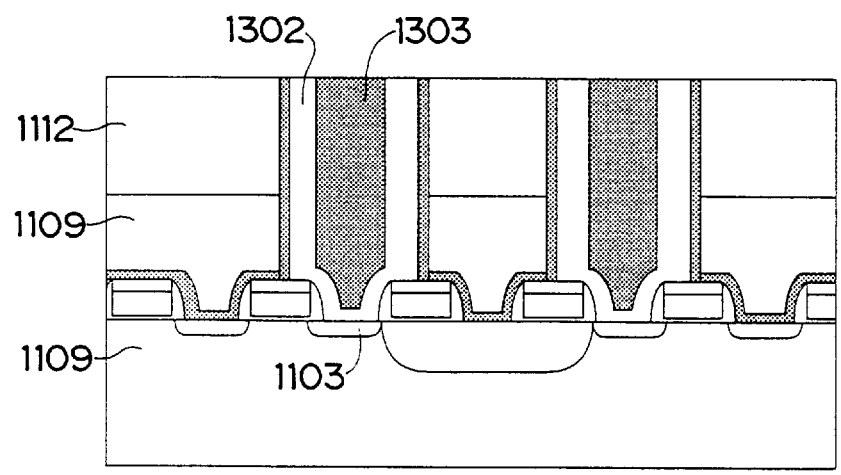
F I G. 4 1
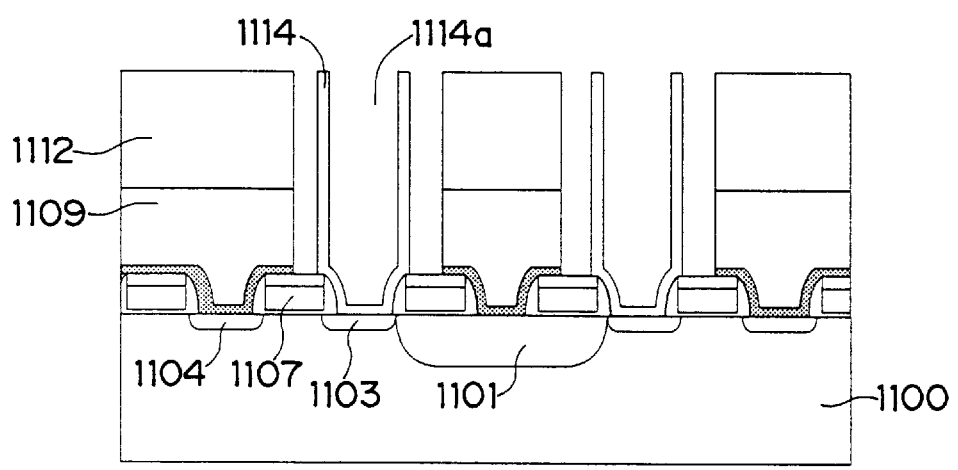

DRAM-CAPACITOR STRUCTURE

FIELD OF THE INVENTION

This invention relates to an improvement applicable to a semiconductor device employable as a capacitor and to an improvement applicable to a semiconductor memory cell of the one transistor and one capacitor structure.

BACKGROUND OF THE INVENTION

A semiconductor device employable as a capacitor and a semiconductor memory cell employing the one transistor and one capacitor structure are available in the prior art. The semiconductor device employable as a capacitor available in the prior art has a structure consisting of a conductive layer horizontally produced on an insulator layer horizontally produced on a conductive region produced by introducing an impurity along the horizontal top surface of a semiconductor substrate. In other words, the semiconductor device employable as a capacitor available in the prior art has one dielectric plate arranged between two electrodes, all of them extending in the horizontal direction. Incidentally, the semiconductor memory cell of the one transistor and one capacitor structure available in the prior art has a field effect transistor of which the gate acts as a word line, of which the source is connected with a bit line and of which the drain is connected with a capacitor which is produced on top of the foregoing field effect transistor and which has one dielectric plate arranged between two electrodes, all of them extending in the horizontal direction. The other terminal of the capacitor is generally grounded.

Referring to the drawings, the structure of a semiconductor memory cell of the one transistor and one capacitor structure available in the prior art and a process for producing the same will be described below.

FIG. 1 is a plan view of plural semiconductor memory cells available in the prior art and FIG. 2 is a cross section of a semiconductor memory cell or of a portion thereof limited by the I–I' arrows shown in FIG. 1.

Referring to FIGS. 1 and 2, a part of the surface of a p-Si substrate 1500 is surrounded by an element separation area 1501 to define an active area 1502, in which a drain 1503, a gate 1507, a source 1504 and a drain 1503 are arranged in a row. In other words, one active area 1502 contains two field effect transistors which hold one source in common. The gate electrode 1507 which is made of a conductive poly crystalline Si layer on a gate insulator layer 1506 and of which the both sides are insulated by insulator side walls 1508, extends in the direction perpendicular to the page of the drawing to constitute a word line. The source 1504 is connected to a bit line 1510 which extends along the page from side to side or in the direction perpendicular to the word line 1507. The source 1504 is connected with the bit line 1510 via a bit contact 1511 which is produced aside of the source 1504 under the bit line 1510. The numeral 1509 indicates an insulator layer covering the field effect transistor described above. The bit line 1510 is produced on the insulator layer 1509, and the numeral 1512 indicates an insulator layer covering the bit line 1510. At a location corresponding to the drain 1503, a contact hole 1513 is produced in the insulator layers 1512 and 1509, to be filled by a conductive poly crystalline Si layer 1514 which extends on the surface of the insulator layer 1512. The contact between the drain 1503 and the conductive poly crystalline Si layer 1514 is called a cell contact 1515. The conductive poly crystalline Si layer 1514 is patterned to produce one electrode 1516 of a capacitor 1519. A dielectric layer 1517 is produced to cover the one electrode 1516. A conductive poly crystalline Si layer is produced on the dielectric layer 1517 to act as the other electrode 1518 of the capacitor 1519. The other electrode 1518 of the capacitor 1519 is connected with a low and fixed electric potential, e.g. the ground level.

Referring to FIGS. 3 through 7, a process for producing the foregoing semiconductor memory cell will be described below.

Referring to FIG. 3, a LOCOS process or the like is employed to produce an element separation area 1501 on a semiconductor (Si in this example) substrate 1500 having one conductivity (p-type in this example).

Referring to FIG. 4, the top surface of the Si substrate 1500 is oxidized to produce a silicon dioxide layer 1506 which is scheduled to be a gate insulator layer, and a CVD process is employed to produce a conductive poly crystalline Si layer 1507. The conductive poly crystalline Si layer 1507 is patterned into the horizontal shape of a gate electrode 1507. The gate electrode 1507 is scheduled to be a word line (See FIG. 1). A CVD process is employed to produce a silicon dioxide layer 1508. The silicon dioxide layer 1508 is etch backed to be remained exclusively on the sides of the gate electrode 1507. Employing the gate electrode 1507 as a mask, an ion implantation process is conducted to introduce an impurity of the other conductivity (n-impurity in this case e.g. phosphorus, arsenic or antimony) in the top surface region of the Si substrate 1500 to produce a drain 1503 and a source 1504. At the edges of the drain 1503 and the source 1504, the impurity of the other conductivity diffuses toward beneath the gate insulator layer 1506 to a marginal extent, during the thermal processes conducted later, so that the drain 1503 and the source 1504 are allowed to contact with a channel which will occur during the operation of the field effect transistor. The drain 1503 is scheduled to be connected with a capacitor which is scheduled to be produced later and the source 1504 is scheduled to be connected with a bit line which extends in a direction perpendicular to the word line 1507 (See FIG. 2), via a bit contact 1511 (See FIG. 1) which is produced in the insulator layers 1509 and 1512 (See FIG. 2) produced on the Si substrate aside of the source 1504 (See FIG. 1).

Referring to FIG. 5, a CVD process is employed to produce a BPSG (silicate glass containing phosphorus and boron) layer 1509. After the bit contact 1511 and the bit line 1510 (See FIG. 1) referred to above are produced by employing CVD processes and photolithography processes, a CVD process is employed to produce a BPSG layer 1512 to insulate the bit line 1510 (See FIG. 1). A dry etching process is employed to produce a contact hole 1513 which reaches the drain 1503, penetrating the insulator layer 1509 and 1512.

Referring to FIG. 6, a CVD process is employed to deposit conductive Si in the contact hole 1513 and on the insulator layer 1512 to produce a conductive poly crystalline Si layer 1516, which is patterned to the horizontal shape of one electrode (or the first electrode) of a capacitor 1519 (See FIG. 7) covering the areas corresponding to the gate 1507 and a part of the neighboring gate 1507 of a field effect transistor belonging to the neighboring memory cell, as shown in the drawing.

Referring to FIG. 7, CVD processes are employed to produce a silicon nitride layer 1517 and a conductive poly crystalline Si layer 1518. Piled layers of the conductive poly crystalline Si layer 1516, the silicon nitride layer 1517 and the conductive poly crystalline Si layer 1518 constitute a capacitor 1519.

In this manner, produced is the capacitor 1519 which horizontally extends along the top surface of a filed effect transistor which acts as the transfer gate for a semiconductor memory cell. Accordingly, the capacity of a capacitor employed in a semiconductor memory cell having the one transistor and one capacitor structure available in the prior art, is determined by the horizontal area of a semiconductor memory cell or the horizontal dimension of a field effect transistor acting as the transfer gate for the semiconductor memory cell. Therefore, the amount of the capacity of the capacitor having the foregoing structure is inclined to be increasingly decreased in the wake of improvement in integration of semiconductor devices.

This drawback can be overcome by an increase in the thickness of the conductive poly crystalline Si layer 1516, because this increase in the thickness of the conductive poly crystalline Si layer 1516 causes an increase in the vertical area of the side wall of the conductive poly crystalline Si layer 1516 (See FIG. 7) and results in an increase in the magnitude of the area with which the two electrodes of the capacitor 1519 face to each other. However, this inevitably increases the thickness of the core domain of the semiconductor memory cells, causing a step to be produced in the thickness between the core domain of the semiconductor memory cell and the domain of the peripheral circuits of the semiconductor memory cell. This step in the thickness between the core domain of the semiconductor memory cell and the domain of the peripheral circuits of the semiconductor memory cell causes various difficulties for producing interconnections between the memory cell proper and the peripheral circuits. The difficulties include difficulty which occurs during the exposure process in which the core domain of the semiconductor memory cell and the domain of the peripheral circuits are concurrently exposed in one step. In other words, if the step is larger than the depth of a focus of the optical equipment employed for the exposing process, it is difficult to focus equally on the two independent domains. Since the depth of a focus determines the size of numerical aperture which determines the resolving power which limits the magnitude of minute processing, the foregoing drawback is more serious for production of a highly integrated semiconductor memory.

The foregoing step in the thickness between the core domain of the semiconductor memory cell and the domain of the peripheral circuits causes another problem for spin coating a photoresist on the core domain of the semiconductor memory cell and the domain of the peripheral circuits. When a photoresist is spin coated, the top surface of the photoresist layer produced on the core domain of the semiconductor memory cell is flush with the photoresist layer produced on the domain of the peripheral circuits. This means that the thickness of the photoresist layer produced on the core domain of the semiconductor memory cell is thinner than that of the photoresist layer produced on the domain of the peripheral circuits. This causes possibility that the photoresist layer produced on the core domain of the semiconductor memory cell does not sufficiently function as an etching mask, due to its thin depth.

OBJECTS AND SUMMARY OF THE INVENTION

A first object of this invention is to provide a semiconductor device employable as a capacitor of which the horizontal dimension is small.

A second object of this invention is to provide a method for producing a semiconductor device employable as a capacitor of which the horizontal dimension is small.

A third object of this invention is to provide a semiconductor memory cell having the one transistor and one capacitor structure, the semiconductor memory cell having a small horizontal dimension.

A fourth object of this invention is to provide a method for producing a semiconductor memory cell having the one transistor and one capacitor structure, the semiconductor memory cell having a small horizontal dimension.

To achieve the first object of this invention, a semiconductor device employable as a capacitor in accordance with this invention comprises:

a semiconductor substrate having a conductive region produced therein along the top surface thereof, a first insulator layer produced on the semiconductor substrate, the first insulator layer having an opening produced therein to reach the conductive region, a conductive pillar arranged in the opening, the conductive pillar being electrically connected with the conductive region, a second insulator layer covering the side and top surfaces of the conductive pillar and the area of the conductive region remained uncovered, and a conductive layer covering the second insulator layer, the conductive layer extending to cover the surface of the second insulator layer and the top surface of the first insulator layer, whereby constituting a capacitor consisting of an electrode of the conductive pillar, a dielectric layer of the second insulator layer and the other electrode of the conductive layer.

To achieve the second object of this invention, a method for producing a semiconductor device employable as a capacitor in accordance with this invention comprises:

a step for producing a first insulator layer on a semiconductor substrate having a conductive region produced therein along the top surface thereof, a step for producing an opening in the first insulator layer, the opening penetrating the first insulator layer to reach the conductive region, a step for producing a layer of a material which accepts an etching process, at least along the internal surface of the opening, a step for etching back the layer of a material which accepts an etching process, to remove the layer from at least the bottom of the opening, a step for producing a layer of a conductive material along at least the surface of the layer of a material which accepts an etching process, a step for removing the layer of a material which accepts an etching process, to remain a conductive pillar which is electrically connected with the conductive region, remaining a first cylindrical space between the conductive pillar and the first insulator layer, a step for lining at least the surface of the conductive pillar with a second insulator layer, remaining a second cylindrical space between the second insulator layer and the first insulator layer, and a step for depositing a conductive material in the second cylindrical space and on the first insulator layer, whereby a capacitor having one electrode of the conductive pillar, a dielectric layer of the second insulator layer and the other electrode of the conductive material deposited in the second cylindrical space, is produced.

The third object of this invention can be achieved by any of the following structures.

To achieve the third object of this invention, a semiconductor memory cell having the one transistor and one capacitor structure in accordance with the first embodiment of this invention comprises:

a field effect transistor further comprising a gate acting as a word line, a source connected with a bit line extending in the direction perpendicular to the word line and a drain connected with an electrode of a capacitor of which the other terminal is connected with a fixed electric potential, wherein:

the field effect transistor being covered by a first insulator layer having an opening therein to reach the drain, and the semiconductor memory cell further comprising:

a conductive pillar arranged in the opening, the conductive pillar being electrically connected with the drain, a second insulator layer covering the side and top surfaces of the conductive pillar and the area of the drain remained uncovered, and a conductive layer covering the second insulator layer, the conductive layer extending to cover the surface of the second insulator layer and the top surface of the first insulator layer.

To achieve the third object of this invention, a semiconductor memory cell having the one transistor and one capacitor structure in accordance with the second embodiment of this invention comprises:

a field effect transistor further comprising a gate acting as a word line, a source connected with a bit line extending in the direction perpendicular to the word line and a drain connected with an electrode of a capacitor of which the other terminal is connected with a fixed electric potential, wherein:

the field effect transistor being covered by a first insulator layer having an opening therein to reach the drain, the opening horizontally extending until the center of the gate and the center of a gate of an adjacent semiconductor memory cell, and the semiconductor memory cell further comprising:

a conductive pillar arranged in the opening, the conductive pillar being electrically connected exclusively with the drain, a second insulator layer covering the side and top surfaces of the conductive pillar, and a conductive layer covering the second insulator layer, the conductive layer extending to cover the surface of the second insulator layer and the top surface of the first insulator layer.

To achieve the third object of this invention, a semiconductor memory cell having the one transistor and one capacitor structure in accordance with the third embodiment of this invention comprises:

a field effect transistor further comprising a gate acting as a word line, a source connected with a bit line extending in the direction perpendicular to the word line and a drain connected with an electrode of a capacitor of which the other terminal is connected with a fixed electric potential, wherein:

the field effect transistor being covered by a first insulator layer having an opening therein to reach the drain, the opening horizontally extending until the center of the gate and the center of a gate of an adjacent semiconductor memory cell, and the semiconductor memory cell further comprising:

a conductive cylinder having a closed bottom and an open top, the conductive cylinder being arranged in the opening, the closed bottom being electrically connected exclusively with the drain, a second insulator layer covering the internal, top and external surfaces of the conductive cylinder, and a conductive layer covering the second insulator layer, the conductive layer extending to cover the surface of the second insulator layer and the top surface of the first insulator layer.

The fourth object of this invention can be achieved by any of the following methods.

To achieve the fourth object of this invention, a method for producing a semiconductor memory cell having the one transistor and one capacitor structure in accordance with the first embodiment of this invention comprises:

a step for producing at least one field effect transistor in a semiconductor substrate of one conductivity, the field effect transistor having a gate acting as a word line, a source being connected with a bit line and a drain being connected with a capacitor of which an electrode is connected with a fixed electric potential, a step for producing a first insulator layer on the field effect transistor, a step for producing an opening in the first insulator layer, the opening penetrating the first insulator layer to reach the drain of the field effect transistor, a step for producing a layer of a material which accepts an etching process, at least along the internal surface of the opening, a step for etching back the layer of a material which accepts an etching process, to remove the layer from at least the bottom of the opening, a step for producing a layer of a conductive material along at least the surface of the material which accepts an etching process, a step for removing the material which accepts an etching process, to remain a conductive pillar which is electrically connected with the drain, remaining a first cylindrical space between the conductive pillar and the first insulator layer, a step for lining at least the surface of the conductive pillar with a second insulator layer, remaining a second cylindrical space between the second insulator layer and the first insulator layer, and a step for depositing a conductive material in the second cylindrical space and on the first insulator layer, whereby the capacitor is produced by a combination of the conductive pillar acting as one electrode, the second insulator layer acting as a dielectric layer and the conductive material deposited in the second cylindrical layer acting as the other electrode.

To achieve the fourth object of this invention, a method for producing a semiconductor memory cell having the one transistor and one capacitor structure in accordance with the second embodiment of this invention comprises:

a step for producing at least one field effect transistor in a semiconductor substrate of one conductivity, the field effect transistor having a gate of which the top surface and the sides are insulated and acting as a word line, a source being connected with a bit line and a drain being connected with a capacitor of which an electrode is connected with a fixed electric potential, a step for producing a first insulator layer on the field effect transistor, a step for producing an opening in the first insulator layer, the opening penetrating the first insulator layer to reach the drain of the field effect transistor and having a horizontal width to reach the center of the adjacent gates, a step for producing a layer of a material which accepts an etching process, at least along the internal surface of the opening, a step for etching back the layer of a material which accepts an etching process, to remove the layer from at least the bottom of the opening, a step for depositing a conductive material in the opening for covering at least the surface of the layer of a material which accepts an etching process, a step for removing the layer of a material which accepts an etching process, to remain a conductive pillar which is electrically connected exclusively with the drain, remaining a first cylindrical space between the conductive pillar and the first insulator layer, a step for lining at least the surface of the conductive pillar with a second insulator layer, remaining a second cylindrical space between the second insulator layer and the first insulator layer, and a step for depositing a conductive material in the second cylindrical space and on the first insulator layer, whereby the capacitor is produced by a combination of the conductive pillar acting as one electrode, the second insulator layer acting as a dielectric layer and the conductive material deposited in the second cylindrical space acting as the other electrode.

To achieve the fourth object of this invention, a method for producing a semiconductor memory cell having the one transistor and one capacitor structure in accordance with the third embodiment of this invention comprises:

a step for producing at least one field effect transistor in a semiconductor substrate of one conductivity, the field effect transistor having a gate of which the top surface and the sides are insulated and acting as a word line, a source being connected with a bit line and a drain being connected with a capacitor of which an electrode is connected with a fixed electric potential, a step for producing a first insulator layer on the field effect transistor, a step for producing an opening in the first insulator layer, the opening penetrating the first insulator layer to reach the drain of the field effect transistor and having a horizontal width to reach the center of the adjacent gates, a step for producing a layer of a material which accepts an etching process, at least along the internal surface of the opening, a step for etching back the layer of a material which accepts an etching process, to remove the layer from at least the bottom of the opening, a step for lining the internal surface of the opening with a conductive material, a step for depositing a material which accepts an etching process, at least in the opening, a step for removing the material which accepts an etching process and the conductive material from the top surface of the first insulator layer, a step for entirely removing the material which accepts an etching process, to remain a conductive cylinder having a closed bottom electrically connected with the drain, a step for lining the entire surface of the conductive cylinder with an dielectric material to produce a dielectric layer, remaining a slit between the conductive cylinder and the first insulator layer, and a step for depositing a conductive material in the slit remained between the conductive cylinder and the first insulator layer and in the opening, whereby the capacitor is produced by a combination of the conductive cylinder acting as one electrode, the layer of the dielectric material covering the entire surface of the conductive cylinder acting as a dielectric layer and the layer of the conductive material deposited in the slit remained between the conductive cylinder and the first insulator layer and in the opening acting as the other electrode.

BRIEF DESCRIPTION OF THE DRAWINGS

This invention, together with its various features and advantages, can be readily understood from the following more detailed description presented in conjunction with the following drawings, in which:

FIG. 13 is a cross section of a semiconductor memory cell of the one transistor and one capacitor structure in accordance with the first embodiment of this invention, under production employing the first method, FIG. 14 is a cross section of a semiconductor memory cell of the one transistor and one capacitor structure in accordance with the first embodiment of this invention, under production employing the first method, FIG. 15 is a cross section of a semiconductor memory cell of the one transistor and one capacitor structure in accordance with the first embodiment of this invention, under production employing the first method, FIG. 21 is a cross section of a semiconductor memory cell of the one transistor and one capacitor structure in accordance with the first embodiment of this invention, under production employing the second method, FIG. 22 is a cross section of a semiconductor memory cell of the one transistor and one capacitor structure in accordance with the first embodiment of this invention, under production employing the second method, FIG. 28 is a cross section of a semiconductor memory cell of the one transistor and one capacitor structure in accordance with the second embodiment of this invention, under production, FIG. 29 is a cross section of a semiconductor memory cell of the one transistor and one capacitor structure in accordance with the second embodiment of this invention, under production, FIG. 30 is a cross section of a semiconductor memory cell of the on transistor and one capacitor structure in accordance with the second embodiment of this invention, under production, FIG. 31 is a cross section of a semiconductor memory cell of the one transistor and one capacitor structure in accordance with the second embodiment of this invention, under production, FIG. 34 is a cross section of a semiconductor memory cell of the one transistor and one capacitor structure in accordance with the third embodiment of this invention, under production, FIG. 35 is a cross section of a semiconductor memory cell of the one transistor and one capacitor structure in accordance with the third embodiment of this invention, under production, FIG. 36 is a cross section of a semiconductor memory cell of the one transistor and one capacitor structure in accordance with the third embodiment of this invention, under production, FIG. 37 is a cross section of a semiconductor memory cell of the one transistor and one capacitor structure in accordance with the third embodiment of this invention, under production, FIG. 38 is a cross section of a semiconductor memory cell of the one transistor and one capacitor structure in accordance with the third embodiment of this invention, under production, FIG. 39 is a cross section of a semiconductor memory cell of the one transistor and one capacitor structure in accordance with the third embodiment of this invention, under production, FIG. 40 is a cross section of a semiconductor memory cell of the one transistor and one capacitor structure in accordance with the third embodiment of this invention, under production, FIG. 41 is a cross section of a semiconductor memory cell of the one transistor; and one capacitor structure in accordance with the third embodiment of this invention, under production.

DETAILED DESCRIPTION OF THE PREFERRED EMBODIMENTS

Figure 1:
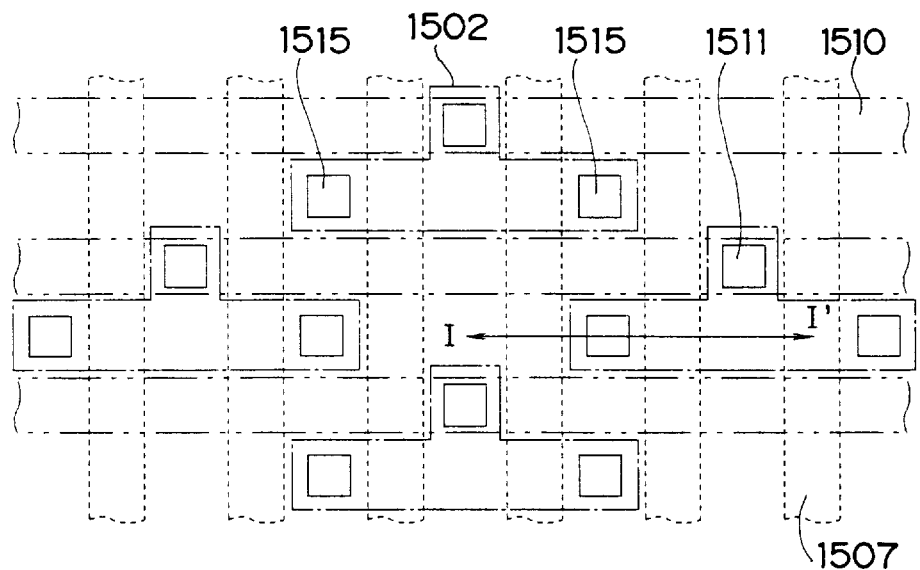
FIG. 1 is a plan view of plural semiconductor memory cells of the one transistor and one capacitor structure available in the prior art.
Figure 2:
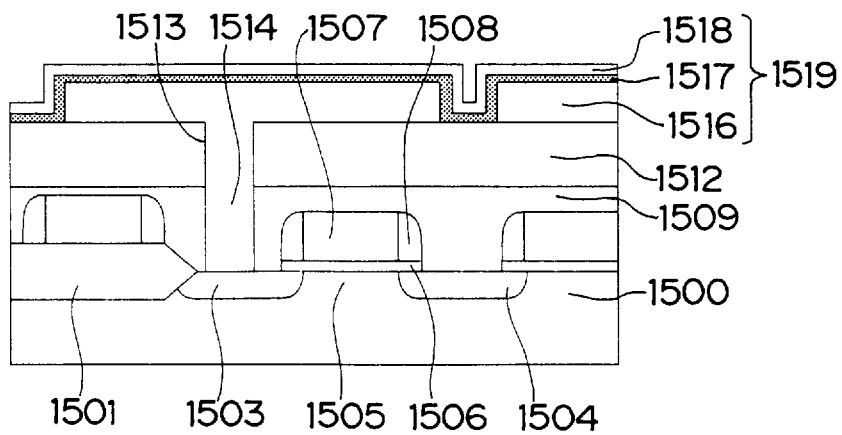
FIG. 2 is a cross section of a semiconductor memory cell of the one transistor and one capacitor structure available in the prior art or of a portion thereof limited by the I–I' arrows shown in FIG. 1.
Figure 3:
FIG. 3 is a cross section of a semiconductor memory cell of the one transistor and one capacitor structure available in the prior art, under production.
Figure 4:
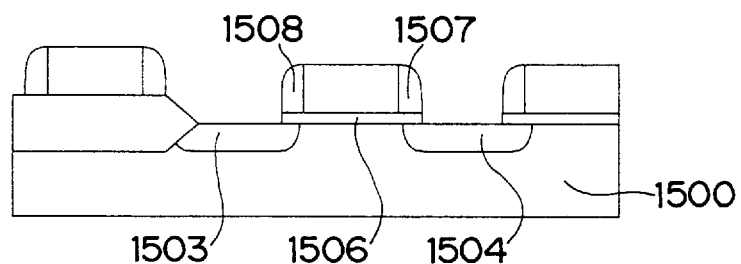
FIG. 4 is a cross section of a semiconductor memory cell of the one transistor and one capacitor structure available in the prior art, under production.
Figure 5:
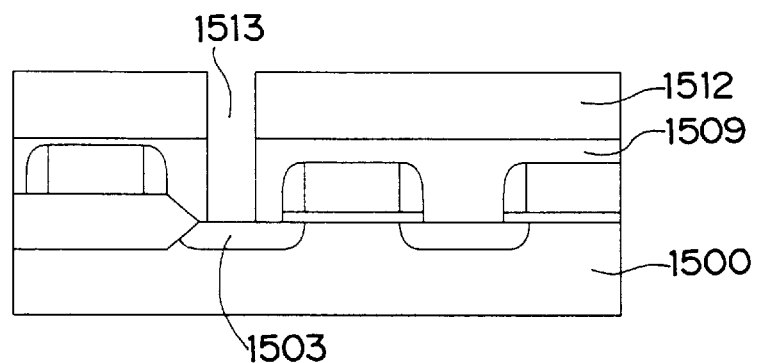
FIG. 5 is a cross section of a semiconductor memory cell of the one transistor and one capacitor structure available in the prior art, under production.
Figure 6:
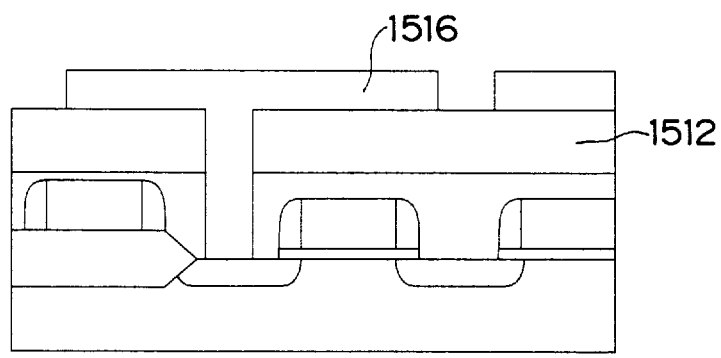
FIG. 6 is a cross section of a semiconductor memory cell of the one transistor and one capacitor structure available in the prior art, under production.
Figure 7:
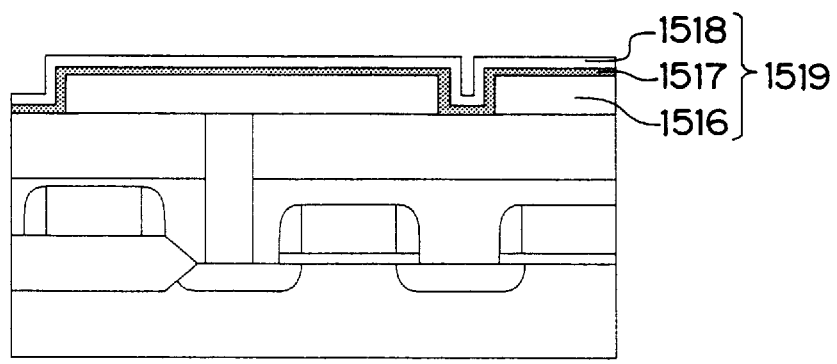
FIG. 7 is a cross section of a semiconductor memory cell of the one transistor and one capacitor structure available in the prior art, under production.

Referring to drawings, a detailed description will be presented below for semiconductor memory cells of the one transistor and one capacitor structure in accordance with three independent embodiments of this invention.

FIRST EMBODIMENT

Referring to the drawings, a semiconductor memory cell of the one transistor and one capacitor structure in accordance with the first embodiment of this invention will be described below.

Figure 8:
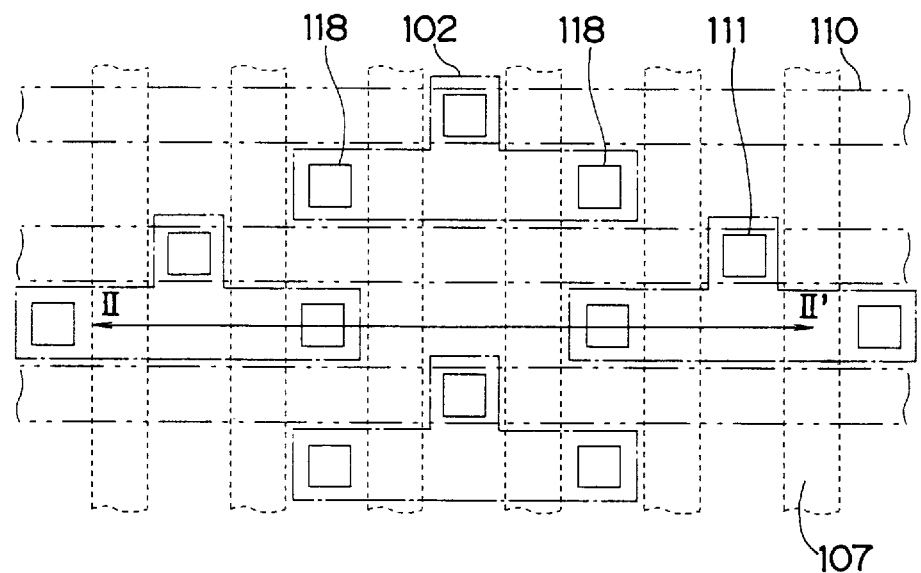
FIG. 8 is a plan view of plural semiconductor memory cells of the one transistor and one capacitor structure in accordance with the first embodiment of this invention.
Figure 9:
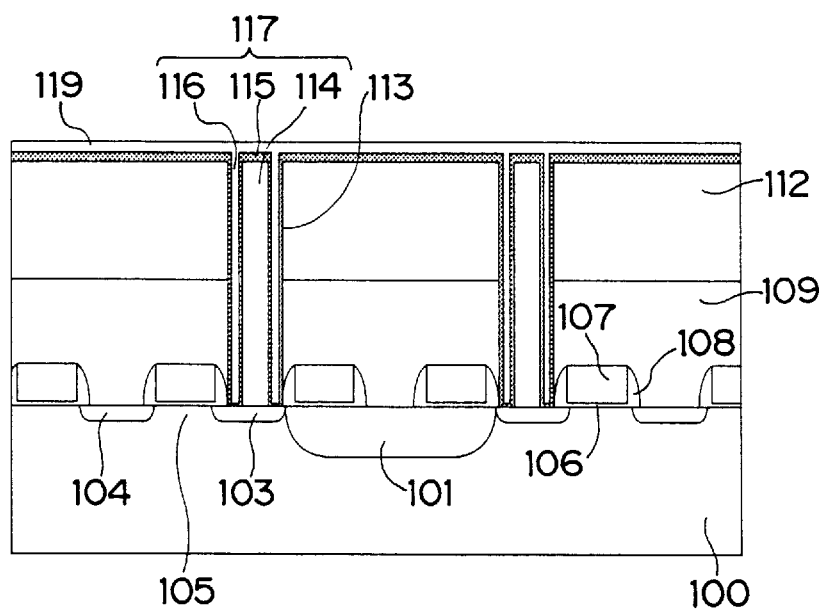
FIG. 9 is a cross section of a semiconductor memory cell of the one transistor and one capacitor structure in accordance with the first embodiment of this invention, or of a portion thereof limited by the II–II' arrows shown in FIG. 8.

FIG. 8 is a plan view of plural semiconductor memory cells of the one transistor and one capacitor structure in accordance with the first embodiment of this invention, and FIG. 9 is a cross section of a semiconductor memory cell of the one transistor and one capacitor structure in accordance with the first embodiment of this invention or of a portion thereof limited by the II–II' arrows shown in FIG. 8.

Referring to FIGS. 8 and 9, a part of the surface of a p-Si substrate 100 is surrounded by an element separation area 101 to define an active area 102, in which a drain 103, a gate 107, a source 104 and a drain 103 are arranged in a row. In other words, one active area 102 contains two field effect transistors which hold one source in common. The gate electrode 107 which is made of a conductive poly crystalline Si layer on a gate insulator layer 106 and of which the both sides are insulated by insulator side walls 108, extends in the direction perpendicular to the page of the drawing to act as a word line. The source 104 is connected with a bit line 110 which extends along the page of the drawing from side to side. The source 104 is connected with the bit line 110 via a bit contact 111 which is produced aside of the source 104 under the bit line 110. The bit line 110 is produced on an insulator layer 109 which insulates the foregoing field effect transistor. Incidentally, the bit line 110 is insulated by an insulator layer 112. At a location corresponding to the drain 103, an opening 113 is produced to penetrate the insulator layers 112 and 109. A conductive pillar 114 of conductive poly crystalline Si is arranged in the opening 113. The conductive pillar 114 acts as the first electrode of a capacitor 117. The bottom of the conductive pillar 114 is electrically connected with the drain 103 via a cell contact 118. A space remains between the external surface of the conductive pillar 114 and the internal surface of the opening 113. The circumferential surface and the top surface of the conductive pillar 114 are covered by a dielectric layer 115, which also covers the area of the drain 103 remaining uncovered by the conductive pillar 114, the internal surface of the opening 113 and the top surface of the insulator layer 112. The external surface of the dielectric layer 115 which covers the conductive pillar 114 is covered by a conductive layer 116 of conductive poly crystalline Si, which acts as the second electrode of the capacitor 117. The conductive layer 116 continues to a conductive layer 119 which extends on the top surface of the BPSG layer 112, and is connected with a low and fixed electric potential such as the ground level.

As was described above, the electrodes 114 and 116 and the dielectric plate 115 of the capacitor 117 extend in the vertical direction in this embodiment, so that the capacity can be increased independently of the horizontal area of the field effect transistor which acts as the transfer gate. This means that a large capacity can be provided, irrespective of the technical improvement regarding the integration of a semiconductor device. Incidentally, since the top surface of the core domain of the semiconductor memory cell of this invention is flush with that of the peripheral circuits, there is no difficulty in producing the core domain of the semiconductor memory cell and the domain of the peripheral circuits concurrently in one step.

FIRST METHOD

Referring to FIGS. 10 through 15, a method for producing a semiconductor memory cell of the one transistor and one capacitor structure in accordance with the first embodiment of this invention will be described below.

Figure 10:
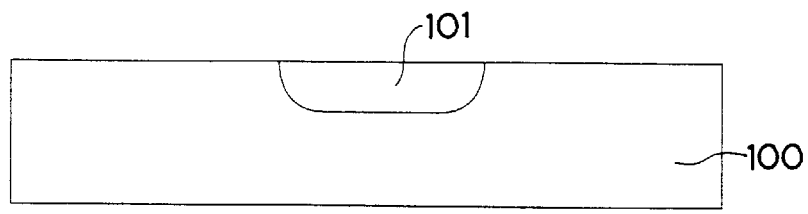
FIG. 10 is a cross section of a semiconductor memory cell of the one transistor and one capacitor structure in accordance with the first embodiment of this invention, under production employing the first method.

Referring to FIG. 10, a photolithography process is employed to produce a recessed groove in a semiconductor (Si in this example) substrate 100 of one conductivity type (p-type in this example) at a location where an element separation area is to be produced. A CVD process is conducted, employing again an etching mask once employed in the former step, to bury silicon dioxide in the recessed groove, to produce an element separation area 101. The foregoing process is employed to produce an element separation area because the foregoing process is effective to improve the integration of a semiconductor device. It is needless to emphasize that a LOCOS process et al. is also allowed for the process.

Figure 11:
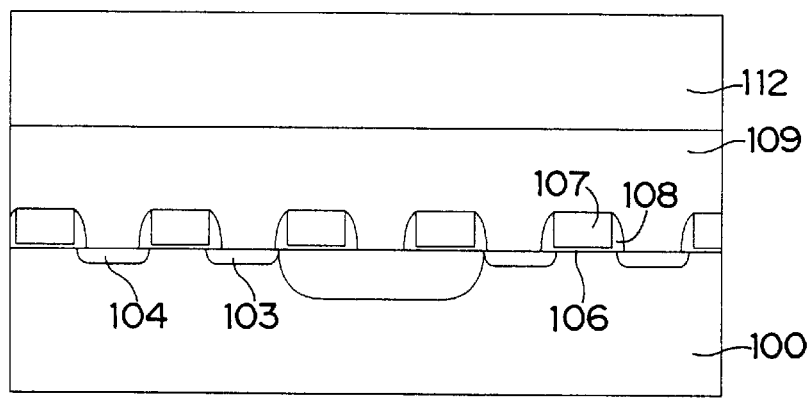
FIG. 11 is a cross section of a semiconductor memory cell of the one transistor and one capacitor structure in accordance with the first embodiment of this invention, under production employing the first method.

Referring to FIG. 11, field effect transistors are produced on the Si substrate 100. The surface of the p-Si substrate 100 is oxidized to produce a silicon dioxide layer 106 which acts as a gate insulator layer. A CVD process is employed to produce a conductive poly crystalline Si layer 107 which acts as a gate electrode and a word line. The conductive poly crystalline Si layer 107 and the silicon dioxide layer 106 are patterned into the horizontal shape of the gate electrode, which extends in a direction perpendicular to the page of the drawing, so that the gate electrode 107 is allowed to act also as a word line. A CVD process is employed to produce a silicon dioxide layer 108 which covers the gate electrode 107 and the p-Si substrate 100. The silicon dioxide layer 108 is etched back to remain exclusively on the sides of the gate electrode 107 as side walls. Using the gate electrode 107 as a mask, an ion implantation process is conducted to introduce an n-impurity in the surface region of the p-Si substrate 100 to produce a drain 103 and a source 104. The n-impurity diffuses beneath the gate insulator layer 106 to a marginal extent, during the thermal process conducted later, so that the drain 103 and the source 104 are allowed to contact with a channel 105 (See FIG. 9) which will exist during the operation of the field effect transistor.

A CVD process is employed to produce a BPSG (silicate glass containing phosphorus and boron) layer 109. After a bit contact 111 (See FIG. 8) which contacts the source 104, is produced, a bit line 110 (See FIG. 8) is produced in a direction perpendicular to the word line 107 (See FIG. 9) or along the surface of the page of the drawing from side to side. Since the bit line 110 is located remote from the page of the drawing, it is not illustrated in FIG. 11. A CVD process is employed to produce a BPSG layer 112 to insulate the bit line 110.

Figure 12:
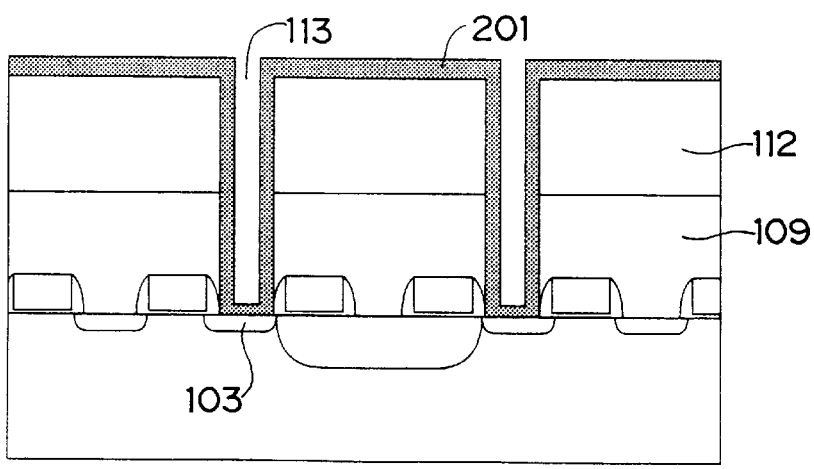
FIG. 12 is a cross section of a semiconductor memory cell of the one transistor and one capacitor structure in accordance with the first embodiment of this invention, under production employing the first method.

Referring to FIG. 12, a photolithography process is employed to produce an opening or a contact hole 113 to penetrate the BPSG layers 112 and 109 and to reach the drain 103. A CVD process is employed to deposit silicon nitride along the internal surface of the contact hole 113 and on the top surface of the BPSG layer 112. During this CVD process, the contact hole 113 is not necessarily filled but the internal surface of the contact hole 113 is covered by a silicon nitride layer 201. A reduced pressure CVD process is appropriate for the foregoing process, because the process can produce a layer with a high magnitude of thickness accuracy and with good coverage. The reduced pressure CVD process can be conducted employing a mixed gas containing $SiCl_2H_2$ and $NH_3$ at the ratio of 1:3 under pressure of 0.1–10 Torr, maintaining the temperature of the substrate at 700° C.

The thickness of the silicon nitride layer 201 is important, because this thickness determines the total thickness of two dielectric layers and a second electrode of a capacitor 117 to be produced in a later process. If the thickness of the silicon nitride layer 201 is too thin, the thickness of the second electrode 116 of the capacitor 117 (See FIG. 9) becomes thin, causing a high amount of resistance therefor, and if the thickness of the silicon nitride layer 201 is too thick, the thickness of the first electrode 114 of the capacitor 117 (See FIG. 9) or of the conductive pillar 114 (See FIG. 9) must be thin, causing a high amount of resistance therefor. As a result, the preferable thickness of the silicon nitride layer 201 is approximately 50 nm.

Referring to FIG. 13, the silicon nitride layer 201 is etched back, to remain exclusively along the internal surface of the contact hole 113. An anisotropic etching process is essential for the foregoing etching back process. A CVD process is employed to deposit conductive poly crystalline Si in the contact hole 113 and on the top surface of the BPSG layer 112 to produce a conductive poly crystalline Si layer 301. The CVD process can be conducted employing a mixed gas containing $SiH_4$ and $PH_3$ at the ratio of 6:1 under pressure of 400 mTorr, maintaining the temperature of the substrate at 600° C.

Referring to FIG. 14, the conductive poly crystalline Si layer 301 is etched back to remain exclusively in the contact hole 113. An anisotropic etching process is essential also for this process.

Referring to FIG. 15, the silicon nitride layer 201 remaining in the contact hole 113 is removed employing a wet etching process which employs an etchant containing hot phosphoric acid.

In this manner, a conductive pillar 114 electrically connected with the drain 103 of the transfer gate and which acts as the first electrode of a capacitor 117 (See FIG. 9), is produced.

Referring to FIG. 9, a CVD process is employed to produce a silicon nitride layer 115 along the surfaces of the conductive pillar 114, on the surface of the drain 103 remaining uncovered and along the surface of the BPSG layers 109 and 112. It is important to insulate the drain 103. The silicon nitride layer 115 acts as the dielectric layer for the capacitor 117. The CVD process which can be employed for this process is a reduced pressure CVD process to be conducted employing a mixed gas containing $SiCl_2H_2$ and $NH_3$ at the ratio of 1:3 under a pressure of 0.1–10 Torr, maintaining the temperature of the substrate at 700° C.

A CVD process is employed to deposit conductive poly crystalline Si in the space or slit remained in the contact hole 113 or between the silicon nitride layers 115 produced along the conductive pillar 114 and along the BPSG layers 112 and 109, to produce the second electrode 116 of the capacitor 117, and a wiring 119 connecting the second electrode 116 with a low and fixed electric potential, such as the ground level (not shown). A patterning process is applied to the conductive poly crystalline Si layer 116 to shape it to the wiring 119. The CVD process which can be employed for this process is a CVD process to be conducted employing a mixed gas containing $SiH_4$ and $PH_3$ at the ratio of 6:1 under pressure of 400 mTorr, maintaining the substrate temperature at 600° C.

It is needless to emphasize that the peripheral circuits are concurrently produced with the foregoing process.

Thereafter, the ordinary processes for passivation and for wirings are conducted.

The foregoing description has clarified that a semiconductor memory cell of the one transistor and one capacitor structure and which has smaller horizontal dimensions, has been successfully provided by the first embodiment of this invention. It is noted that the semiconductor memory cell can readily replace the technical improvement regarding the integration of semiconductor devices, by providing advantages otherwise provided technical improvements in the area of integration of semiconductor devices.

Further, it is noted that the foregoing method for producing a semiconductor memory cell of the one transistor and one capacitor structure in accordance with the first embodiment of this invention is much simplified in comparison with a method for producing a semiconductor memory cell of the one transistor and one capacitor structure in which the capacitor is a combination of horizontal plates.

SECOND METHOD

Referring to FIGS. 16 through 22, another method for producing a semiconductor memory cell of the one transistor and one capacitor structure in accordance with the first embodiment of this invention will be described below.

Figure 16:
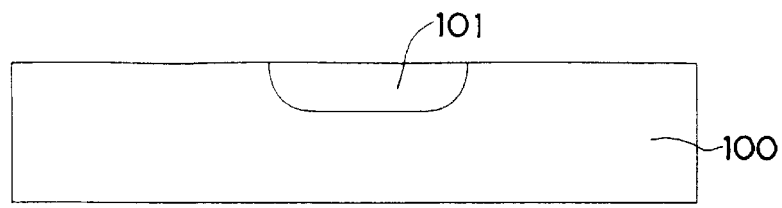
FIG. 16 is a across section of a semiconductor memory cell of the one transistor and one capacitor structure in accordance with the first embodiment of this invention, under production employing the second method.

Referring to FIG. 16, a photolithography process is employed to produce a recessed groove in a p-Si substrate 100 at a location where an element separation area is to be produced. A CVD process is employed to bury silicon dioxide selectively in the recessed groove, to produce an element separation area 101. This process can be replaced by a LOCOS process.

Figure 17:
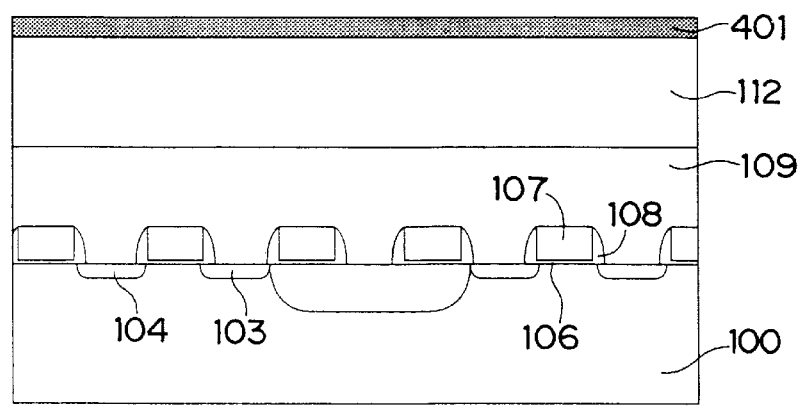
FIG. 17 is a cross section of a semiconductor memory cell of the on transistor and one capacitor structure in accordance with the first embodiment of this invention, under production employing the second method.

Referring to FIG. 17, field effect transistors are produced on the Si substrate 100. The surface of the p-Si substrate 100 is oxidized to produce a silicon dioxide layer 106 which acts as a gate insulator layer. A CVD process is employed to produce a conductive poly crystalline Si layer 107 which acts as a gate electrode and a word line. The conductive poly crystalline Si layer 107 and the silicon dioxide layer 106 are patterned into the horizontal shape of the gate electrode, which extends in a direction perpendicular to the page of the drawing, so that the gate electrode 107 is allowed to act also as a word line. A CVD process is employed to produce a silicon dioxide layer 108 which covers the gate electrode 107 and the p-Si substrate 100. The silicon dioxide layer 108 is etched back to remain exclusively on the sides of the gate electrode 107 as side walls. Using the gate electrode 107 as a mask, an ion implantation process is conducted to introduce an n-impurity in the surface region of the p-Si substrate 100 to produce a drain 103 and a source 104.

A CVD process is employed to produce a BPSG layer 109. After a bit contact 111 (See FIG. 8) which contacts the source 104, is produced, a bit line 110 (See FIG. 8) is produced in a direction perpendicular to the word line 107 (See FIG. 9) or along the surface of the page of the drawing from side to side. A CVD process is employed to produce a BPSG layer 112 to insulate the bit line 110. A reduced pressure CVD process is employed to produce a silicon nitride layer 401 having a thickness of, e.g. 50 nm on the BPSG layer 112.

Figure 18:
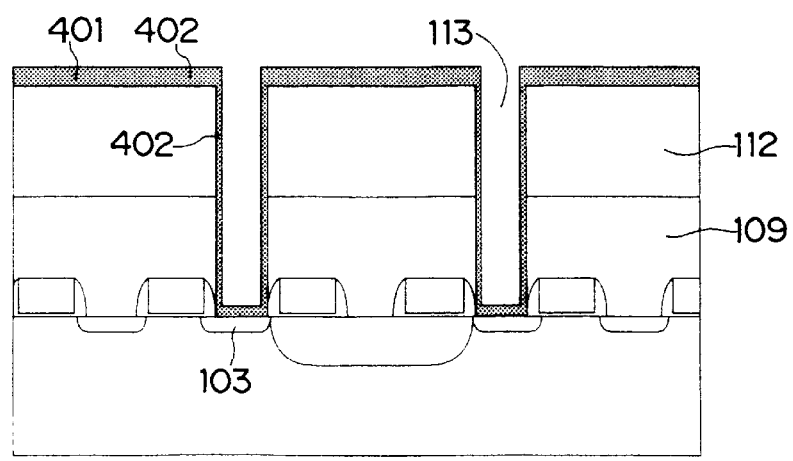
FIG. 18 is a cross section of a semiconductor memory cell of the one transistor and one capacitor structure in accordance with the first embodiment of this invention, under production employing the second method.

Referring to FIG. 18, a photolithography process is employed to produce an opening or a contact hole 113 to penetrate the silicon nitride layer 401, and BPSG layers 112 and 109 and to reach the drain 103. A CVD process is employed to produce a silicon nitride layer 402 in the contact hole 113 and on the silicon nitride layer 401. During this CVD process, the contact hole 113 is not necessarily filled but the internal surface of the contact hole 113 is lined by the silicon nitride layer 402.

Figure 19:
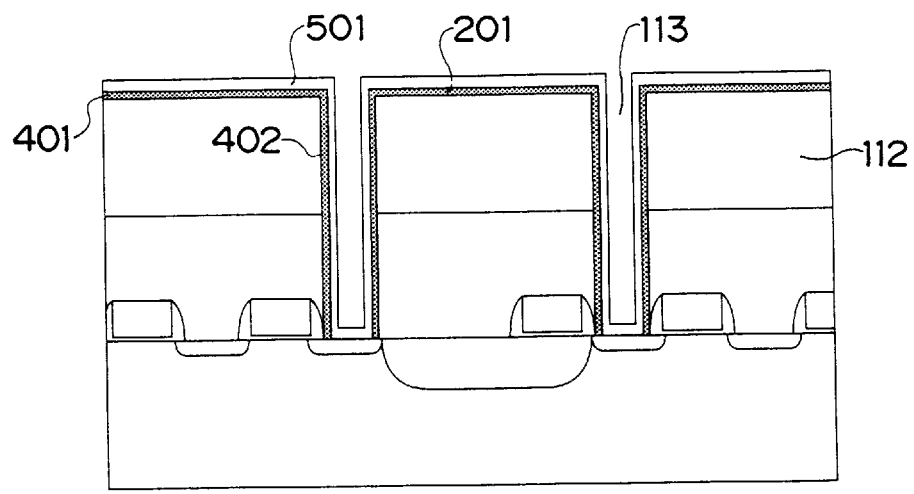
FIG. 19 is a cross section of a semiconductor memory cell of the one transistor and one capacitor structure in accordance with the first embodiment of this invention, under production employing the second method.

Referring to FIG. 19, an anisotropic etching process is applied to the silicon nitride layer 402 to remove the silicon nitride layer 402 from the bottom of the contact hole 113 and from the top surface of the silicon nitride layer 401. This etching process retains the silicon nitride layer 402 along the internal surface of the contact hole 113 and the silicon nitride layer 401 on the top of the BPSG layer 112. A CVD process is employed to produce a silicon dioxide layer 501 in the contact hole 113 and on the silicon nitride layer 401.

The thickness of the silicon dioxide layer 501 is important, because this thickness determines the total thickness of the dielectric layer and a second electrode of a capacitor to be produced in the later process. In order to make the resistance of the both first and second electrodes of the capacitor less, the thickness of the silicon dioxide layer 501 is preferably approximately 50 nm.

Figure 20:
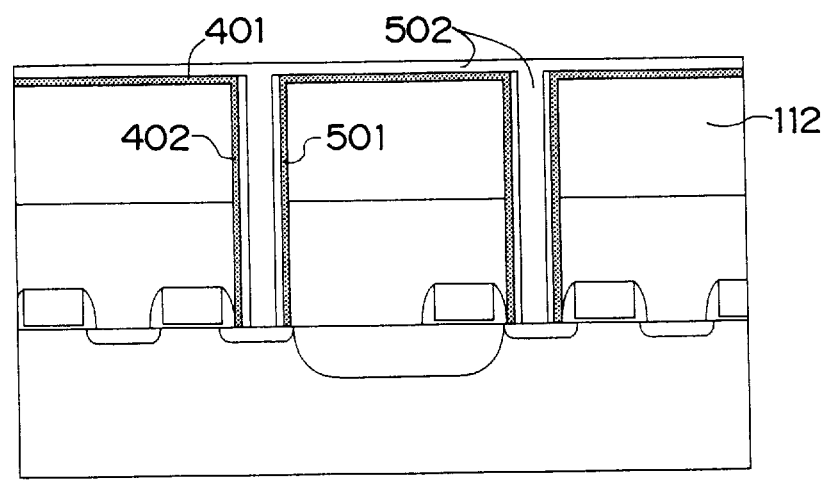
FIG. 20 is a cross section of a semiconductor memory cell of the one transistor and one capacitor structure in accordance with the first embodiment of this invention, under production employing the second method.

Referring to FIG. 20, an anisotropic etching process is applied to the silicon dioxide layer 501 to remove the silicon dioxide layer 501 from the bottom of the contact hole 113 and from the top of the silicon nitride layer 401. A CVD process is employed to produce a conductive poly crystalline Si layer 502 in the contact hole 113 and on the top surface of the silicon nitride layer 401. The CVD process for this process can be conducted employing a mixed gas containing $SiH_4$ and $PH_3$ at a ratio of 6:1 under a pressure of 400 mTorr, maintaining the substrate temperature at 600° C.

Referring to FIG. 21, the conductive poly crystalline Si layer 502 is removed from the top surface of the silicon nitride layer 401, with the result that a conductive pillar 114 remains in the contact hole 113. The bottom of the conductive pillar 114 is electrically connected with the drain 103. A wet etching process conducted by employing an etchant containing HF, is employed to remove the silicon dioxide layer 501 remaining in the contact hole 113. Since the etchant containing HF is non-reactive with silicon nitride, the silicon nitride layers 401 and 402 remain unremoved.

Referring to FIG. 22, an etching process conducted by employing an etchant containing hot phosphoric acid is employed to remove the silicon nitride layers 401 and 402, respectively, from the top surface of the BPSG layer 112 and form the internal space of the contact hole 113.

The foregoing process has produced the semi-finished product described above, referring to FIGS. 10 through 15.

Referring to FIG. 9, a CVD process is employed to produce a silicon nitride layer 115 along the surfaces of the conductive pillar 114, on the surface of the drain 103 remaining uncovered and along the surface of the BPSG layers 109 and 112. It is important to insulate the drain 103. The silicon nitride layer 115 acts as the dielectric layer for the capacitor 117. The CVD process which can be employed for this process is a reduced pressure CVD process to be conducted employing a mixed gas containing $SiCl_2H_2$ and $NH_3$ at the ratio of 1:3 under a pressure of 0.1–10 Torr, maintaining the temperature of the substrate at 700° C.

A CVD process is employed to deposit conductive poly crystalline Si in the space or slit remained in the contact hole 113 or between the silicon nitride layers 115 produced along the conductive pillar 114 and along the BPSG layers 112 and 109, to produce the second electrode 116 of the capacitor 117, and a wiring 119 connecting the second electrode 116 with a low and fixed electric potential, such as the ground level (not shown). A patterning process is applied to the conductive poly crystalline Si layer 116 to shape it to the wiring 119. The CVD process which can be employed for this process is a CVD process to be conducted employing a mixed gas containing $SiH_4$ and $PH_3$ at the ratio of 6:1 under a pressure of 400 mTorr, maintaining the substrate temperature at 600° C.

It is needless to emphasize that the peripheral circuits are concurrently produced with the foregoing process.

Thereafter, the ordinary processes for passivation and for wirings are conducted.

The foregoing description has clarified that a semiconductor memory cell of the one transistor and one capacitor structure and which has smaller horizontal dimensions, has been successfully produced by another method which is more simplified than the first method described above, referring to FIGS. 10 through 15. It is noted that the second method needs a less lengthy of production time, because wet etching process is employed.

SECOND EMBODIMENT

Referring to FIGS. 23 through 31, a semiconductor memory cell of the one transistor and one capacitor structure in accordance with the second embodiment of this invention will be described below.

Figure 23:
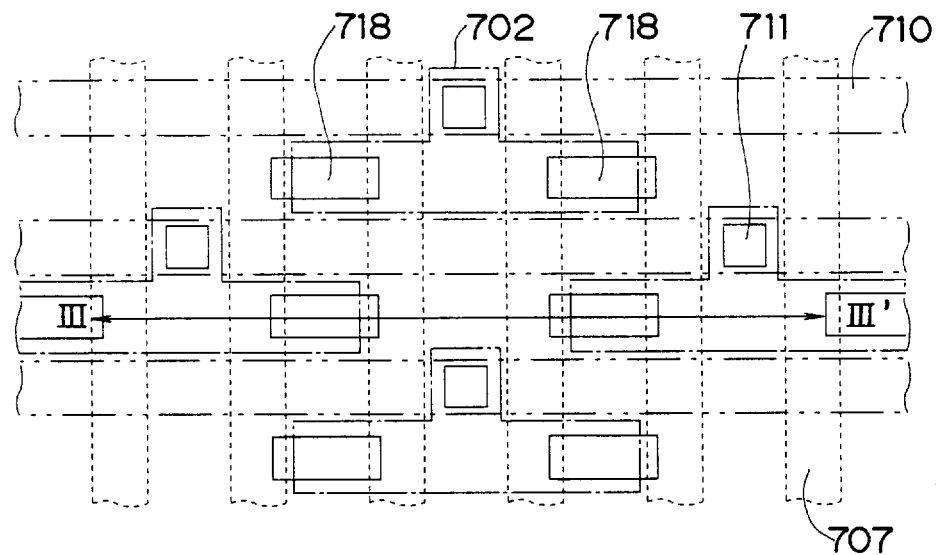
FIG. 23 is a plan view of plural semiconductor memory cells of the one transistor and one capacitor structure in accordance with the second embodiment of this invention.
Figure 24:
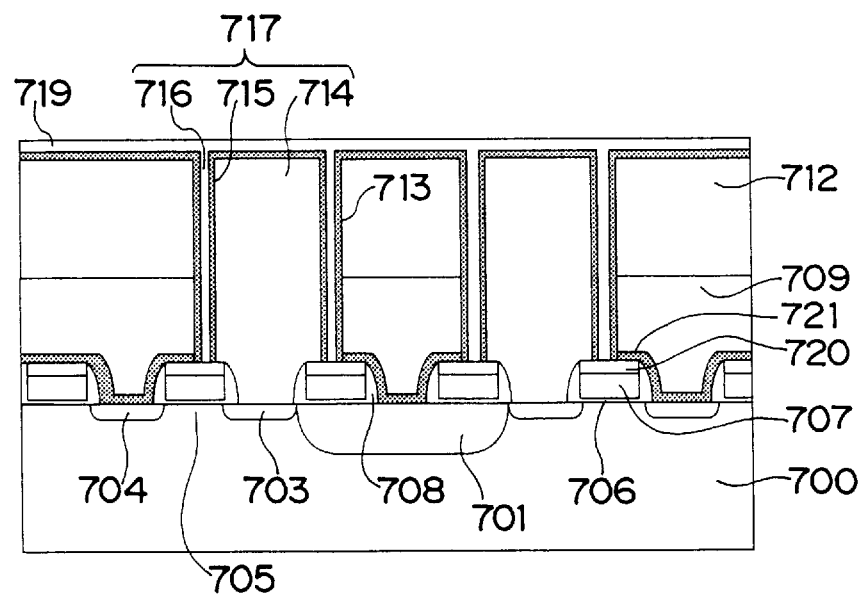
FIG. 24 is a cross section of a semiconductor memory cell of the one transistor and one capacitor structure in accordance with the second embodiment of this invention or of a portion thereof limited by the III–III' arrows shown in FIG. 23.

FIG. 23 is a plan view of plural semiconductor memory cells of the one transistor and one capacitor structure in accordance with the second embodiment of this invention, and FIG. 24 is a cross section of a semiconductor memory cell of the one transistor and one capacitor structure in accordance with the second embodiment of this invention or of portions thereof limited by the area shown by the III–III' arrows shown in FIG. 23.

Referring to FIGS. 23 and 24, the surface of a p-Si substrate 700 is surrounded by an element separation area 701 to define an active area 702, in which a drain 703, a gate 707, a source 704 and a drain 703 are arranged in a row. As is in the case of the first embodiment, one active area 702 contains two field effect transistors which have one source in common. The gate electrode 707, which is made of a conductive poly crystalline Si layer on a gate insulator layer 706, extends in the direction perpendicular to the page of the drawing to act as a word line. The top surface of and both sides of the gate electrode 707 are insulated respectively by a silicon dioxide layer 720 and side walls 708 of silicon dioxide. The source 704 is connected with a bit line 710 which extends along the page of the drawing from side to side. The source 704 is connected with a bit line 710 via a bit contact 711 which is produced aside of the source 704 under the bit line 710. The bit line 710 is produced on an insulator layer 709 which insulates the foregoing field effect transistor. The bit line 710 is insulated by an insulator layer 712. At a location corresponding to the drain 703, an opening or a contact hole 713 is produced to penetrate the insulator layers 712 and 709. A conductive pillar 714 of conductive poly crystalline Si is arranged in the opening or the contact hole 713. The difference between the conductive pillar 114 of the first embodiment and the conductive pillar 714 of the second embodiment is the width thereof. The end of the contact hole 713 of this embodiment reaches the center of the gate 705 of the field effect transistor to which the drain 703 in question belongs, and to the center of the gate electrode which is produced on the element separation area 701 adjacent to the foregoing field effect transistor. As a result, the edges of the conductive pillar 714 are on the top of the adjacent gate electrode 705. The conductive pillar 714 acts as a first electrode of a capacitor 717. A part of the bottom 718 of the conductive pillar 714 is electrically connected with the drain 703. Although the bottom 718 of the conductive pillar 714 contacts also with the gate 707, the conductive pillar 714 is insulated from the gate 707, because the gate 707 is insulated by the silicon dioxide layer 720 and by the side walls 708. A space remains between the external surface of the conductive pillar 714 and the internal surface of the opening 713. The circumferential surface and the top surface of the conductive pillar 714 are covered by a dielectric layer (a silicon nitride layer) 715. The external surface of the dielectric layer 715 is covered by a conductive poly crystalline Si layer 716 which acts as a second electrode of the capacitor 717. The conductive poly crystalline Si layer 716 extends on the BPSG layer 712, and is connected with a low and fixed electric potential such as the ground level (not shown).

Similarly to the first embodiment, the first electrode 714, the second electrode 716 and the dielectric plate 715 of the capacitor 717 extend in the vertical direction, although the surface area of the first electrode 714 of this embodiment is much larger than that of the first electrode 114 of the first embodiment. As a result, results which are similar to that of the first embodiment but which are notably enhanced, is readily realized by this embodiment. In other words, the capacity can be increased independently of the horizontal area of the field effect transistor which acts as the transfer gate. This means that a large capacity can be provided, irrespective of the technical improvement regarding the integration of a semiconductor device. Incidentally, since the top surface of the core domain of the semiconductor memory cell of this invention is flush with that of the peripheral circuits, there is no difficulty in producing the core domain of the semiconductor memory cell and the domain of the peripheral circuits concurrently in one step.

Referring to FIGS. 25 through 31, a method for producing a semiconductor memory cell of the one transistor and one capacitor structure in accordance with the second embodiment of this invention will be described below.

Figure 25:
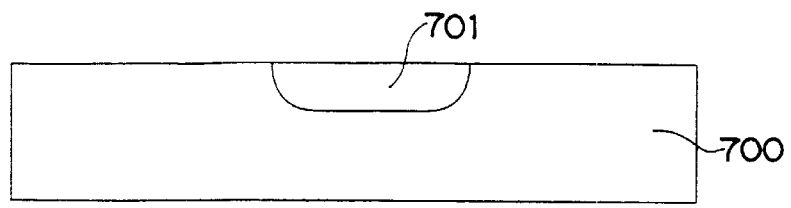
FIG. 25 is a cross section of a semiconductor memory cell of the one transistor and one capacitor structure in accordance with the second embodiment of this invention, under production.

Referring to FIG. 25, a photolithography process is employed to produce a recessed groove in a p-Si substrate 700 at a location where an element separation area is produced. A CVD process is employed to bury silicon dioxide selectively in the recessed groove, to produce an element separation area 701.

Figure 26:
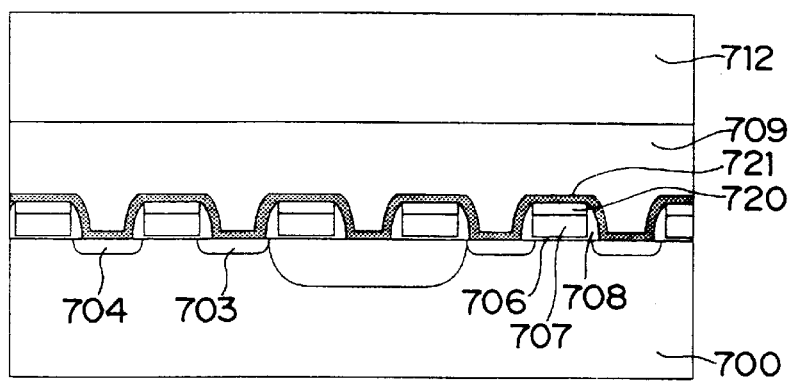
FIG. 26 is a cross section of a semiconductor memory cell of the one transistor and one capacitor structure in accordance with the second embodiment of this invention, under production.

Referring to FIG. 26, field effect transistors are produced on the Si substrate 700. The surface of the p-Si substrate 700 is oxidized to produce a silicon dioxide layer 706 which acts as a gate insulator layer. A CVD process is employed to produce a conductive poly crystalline Si layer 707 which acts as a gate electrode and a word line. A silicon dioxide layer 720 is produced on the conductive poly crystalline layer 707 by employing a CVD process. The silicon dioxide layer 720, the conductive poly crystalline Si layer 707 and the silicon dioxide layer 706 are patterned into the horizontal shape of the gate electrode, which extends in a direction perpendicular to the page of the drawing, so that the gate electrode 707 is allowed to act also as a word line. A CVD process is employed to produce a silicon dioxide layer 708 which covers the gate electrode 707 and the p-Si substrate 700. The silicon dioxide layer 708 is etched back to remain exclusively on the sides of the gate electrode 707 as side walls. Using the gate electrode 707 as a mask, an ion implantation process is conducted to introduce an n-impurity in the surface region of the p-Si substrate 700 to produce a drain 703 and a source 704. A reduced pressure CVD process is employed to produce a silicon nitride layer 721 on the entire surface of the substrate 700. The silicon nitride layer 721 is to be employed as an etching stop layer during a process for producing a contact hole 713 to be conducted later.

A CVD process is employed to produce a BPSG layer 709. After a bit contact 711 (See FIG. 23) which contacts the source 704, is produced, a bit line 710 (See FIG. 23) is produced in a direction perpendicular to the word line 707 (See FIG. 23) or along the surface of the page of the drawing from side to side. A CVD process is employed to produce a BPSG layer 712 to insulate the bit line 710.

Figure 27:
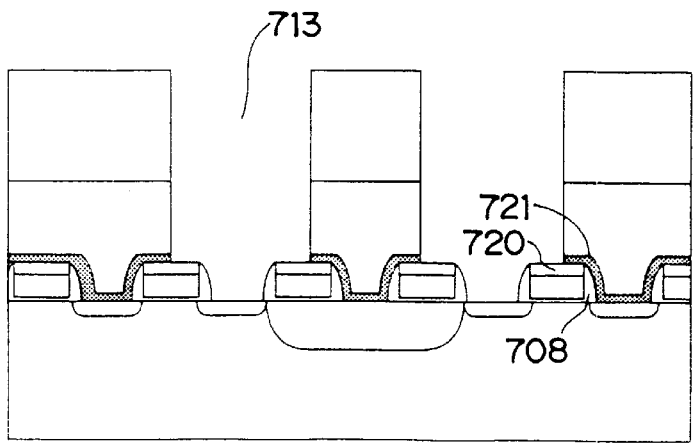
FIG. 27 is a cross section of a semiconductor memory cell of the one transistor and one capacitor structure in accordance with the second embodiment of this invention, under production.

Referring to FIG. 27, a photolithography process is employed to produce an opening or a contact hole 713 to penetrate the BPSG layers 712 and 709 to reach the silicon nitride layer 721. A wet etching process conducted by employing an etchant containing HF can be employed for the process. A wet etching process conducted by employing an etchant containing hot phosphoric acid is employed to remove the silicon nitride layer 721 from the bottom of the contact hole 713.

Referring to FIG. 28, a reduced pressure CVD process is employed to produce a silicon nitride layer 901 along the internal surface of the contact hole 713 and on the top surface of the BPSG layer 712.

The thickness of the silicon nitride layer 901 is important, because this thickness determines the total thickness of two dielectric layers 715 and a second electrode 716 of a capacitor 717 which is produced in the later process. The preferable minimum thickness of the silicon nitride layer 901 is 50 nm. Otherwise, the resistance of the first and/or second electrodes of the capacitor 717 will be notably large. The thickness of the silicon nitride layer 901 is preferably selected to be a quarter of the length of the short side of a rectangle which is the projection of the conductive pillar 714(See FIGS. 23 and 24).

Referring to FIG. 29, an anisotropic etching process is employed to etch back the silicon nitride layer 901 and to remove the silicon nitride layer 901 from the top of the drain 704, such that the silicon nitride layer 901 remains exclusively along the side of the BPSG layers 712 and 709 or along the internal surface of the contact hole 713.

Referring to FIG. 30, a CVD process is employed to deposit conductive poly crystalline Si in the contact hole 713 and on the top surface of the BPSG layer 712 to produce a conductive poly crystalline Si layer 902. The CVD process can be conducted employing a mixed gas containing $SiH_4$ and $PH_3$ at the ratio of 6:1 under a pressure of 400 mTorr, maintaining the temperature of the substrate at 600° C.

The conductive poly crystalline Si layer 902 is etched back to make the top surface of the conductive poly crystalline Si layer 902 flush with the top surface of the BPSG layer 712.

Referring to FIG. 31, a wet etching process conducted by employing an etchant containing hot phosphoric acid is employed to remove the silicon nitride layer 901 remaining between the conductive poly crystalline Si layer 902 and the BPSG layers 712 and 709.

In this manner, a conductive pillar 714 electrically connected with the drain 703 of the transfer gate and which acts as the first electrode of a capacitor 717 (See FIG. 24), is produced. The difference between the conductive pillar 714 of the second embodiment of this invention and the conductive pillar 114 of the first embodiment of this invention is that the surface area of the former is much larger than that of the latter, provided the height thereof of each is the same.

Referring to FIG. 24, a CVD process is employed to produce a silicon nitride layer 715 along the surface of the conductive pillar 714 and along the surface of the BPSG layers 712 and 709. The silicon nitride layer 715 to acts as the dielectric layer for the capacitor 717.

The CVD process which can be employed for this process is a reduced pressure CVD process to be conducted employing a mixed gas containing $SiCl_2H_2$ and $NH_3$ at the ratio of 1:3 under a pressure of 0.1–10 Torr, maintaining the temperature of the substrate at 700° C.

A CVD process is employed to deposit conductive poly crystalline Si in the space or slit remaining in the contact hole 113 or between the silicon nitride layers 715 produced along the conductive pillar 714 and along the BPSG layers 712 and 709, to produce the second electrode 716 of the capacitor 717 and a wiring 719 connecting the second electrode 716 with a low and fixed electric potential, such as the ground level (not shown). A patterning process is applied to the conductive poly crystalline Si layer 716 to shape it to the wiring 719. The CVD process which can be employed for this process is a CVD process to be conducted employing a mixed gas containing $SiH_4$ and $PH_3$ at the ratio of 6:1 under a pressure of 400 mTorr, maintaining the substrate temperature at 600° C.

Thereafter, the ordinary processes for passivation and for wirings are conducted.

The foregoing description has clarified that a semiconductor memory cell of the one transistor and one capacitor structure and which has smaller horizontal dimensions has been provided by the second embodiment of this invention.

It is noted that the capacity of the capacitor of this second embodiment of this invention is much larger than that of the first embodiment of this invention, provided the thicknesses of the core domains of the semiconductor memory cells are equal to each other.

Further, it is noted that the foregoing method for producing a semiconductor memory cell is much simplified in comparison with a method for producing a semiconductor memory cell of the one transistor and one capacitor structure in which the capacitor is a combination of horizontal plates.

THIRD EMBODIMENT

Referring to FIGS. 32 through 41, a semiconductor memory cell of the one transistor and one capacitor structure in accordance with the third embodiment of this invention will be described below.

Figure 32:
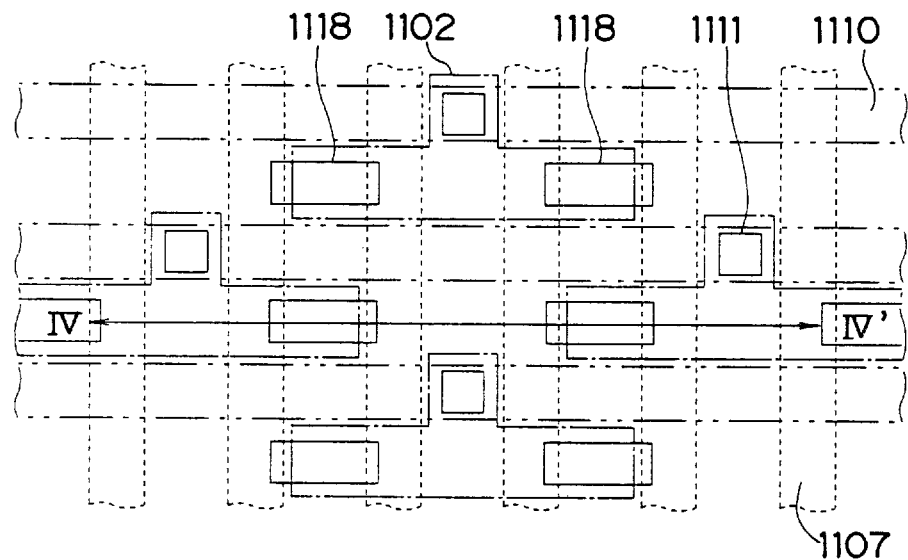
FIG. 32 is a plan view of plural semiconductor memory cells of the one transistor and one capacitor structure in accordance with the third embodiment of this invention.
Figure 33:
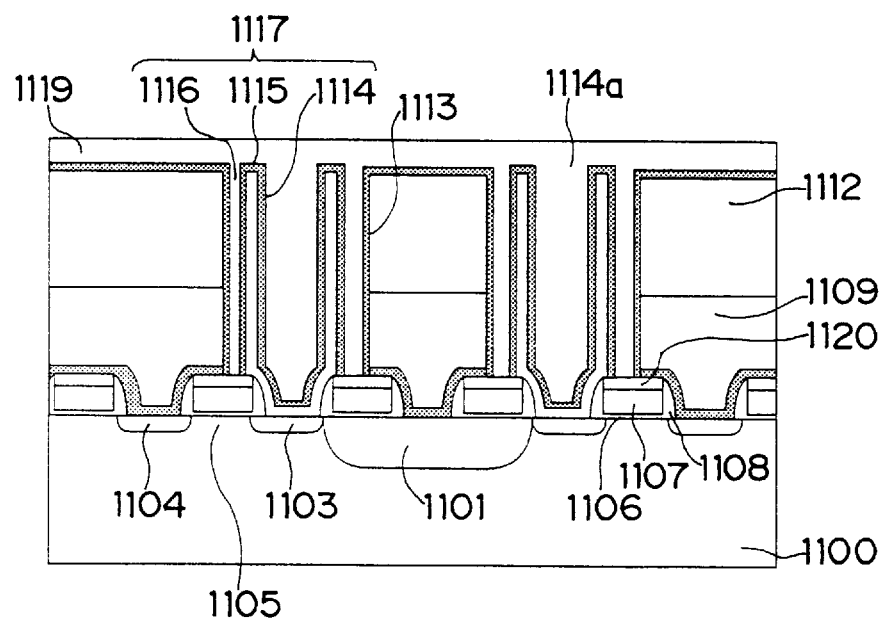
FIG. 33 is a cross section of a semiconductor memory cell of the one transistor and one capacitor structure in accordance with the third embodiment of this invention or of a portion thereof limited by the IV–IV' arrows shown in FIG. 32.

FIG. 32 is a plan view of plural semiconductor memory cells of the one transistor and one capacitor structure in accordance with the third embodiment of this invention, and FIG. 33 is a cross section of a semiconductor memory cell of the one transistor and one capacitor structure in accordance with the third embodiment of this invention or of a portion thereof limited by the area shown by the IV–IV' arrows shown in FIG. 33.

Referring to FIGS. 32 and 33, the surface of a p-Si substrate 1100 is surrounded by an element separation area 1101 to define an active area 1102, in which a drain 1103, a gate 1107, a source 1104 and a drain 1103 are arranged in a row. As in the case of the first and second embodiments, one active area 1102 contains two field effect transistors which have one source in common. The gate electrode 1107, which is made of a conductive poly crystalline Si layer on a gate insulator layer 1106, extends in the direction perpendicular to the page of the drawing to act as a word line. The top surface and both sides of the gate electrode 1107 are insulated respectively by a silicon dioxide layer 1120 and side walls 1108 of silicon dioxide. The source 1104 is connected with a bit line 1110 which extends along the page of the drawing from side to side. The source 1104 is connected with a bit line 1110 via a bit contact 1111 which is produced aside of the source 1104 under the bit line 1110. The bit line 1110 is produced on an insulator layer 1109 which insulates the foregoing field effect transistor. The bit line 1110 is insulated by an insulator layer 1112. At a location corresponding to the drain 1103, an opening or a contact hole 1113 is produced to penetrate the insulator layers 1112 and 1109. A conductive cylinder 1114 of conductive poly crystalline Si is arranged in the opening 1113. The difference between the second embodiment and the third embodiment is that the conductive pillar 714 is replaced by a conductive cylinder 1114, as a result allowing both external and internal surfaces of the conductive cylinder 1114 of the third embodiment to be employed as the facing surface of a capacitor for the ultimate purpose of increasing the capacity. As is in the case of the second embodiment, the end of the contact hole 1113 of this embodiment reaches the center of the gate 1105 of the field effect transistor to which the drain 1103 in question belongs, and to the center of the gate electrode which is produced on the element separation area 1101 adjacent to the foregoing field effect transistor. As a result, the edges of the conductive cylinder 1114 are on the top of the adjacent gate electrodes 705. The conductive cylinder 1114 acts as a first electrode of a capacitor 1117. A part of the bottom 1118 of the conductive cylinder 1114 is electrically connected with the drain 1103. The remaining part of the bottom 1118 of the conductive cylinder 1114 is insulated from the gate 1107, because the gate 1107 is covered by the silicon dioxide layer 1120 and by the side wall 1108 of silicon dioxide. A space remains between the external surface of the conductive cylinder 1114 and the internal surface of the opening 1113. The external surface, the top surface and the internal surface of the conductive cylinder 1114 are covered by a dielectric layer (a silicon nitride layer) 1115. The external surface of the dielectric layer 1115 is covered by a conductive poly crystalline Si layer 1116 which acts as a second electrode of the capacitor 1117. The conductive poly crystalline Si layer 1116 can fill the internal space 1114a of the conductive cylinder 1114. The conductive poly crystalline Si layer 1116 extends on the BPSG layer 1112, which is connected with a low and fixed electric potential such as the ground level (not shown).

Similarly to the first and second embodiments, the first electrode (the conductive cylinder) 1114, the dielectric layer 1115 and the second electrode (the cylindrical layer of conductive poly crystalline Si covering the external surface of the dielectric layer 1115 arranged along the external surface of the conductive cylinder 1114 and the pillar of conductive poly crystalline Si arranged in the internal space 1114a of the conductive cylinder 1114, being isolated from the first electrode 1114 by the dielectric layer 1116) of the capacitor 1117 extend in the vertical direction. In addition, both the external and internal surfaces of the conductive cylinder 1114 act as the facing surface for the capacitor 1117. As a result, the results of the first and second embodiments are sizably enhanced in this embodiment. In other words, the capacity can be increased independently from the horizontal area of the field effect transistor which acts as the transfer gate. This means that a large capacity can be provided, irrespective of the technical improvement regarding the integration of a semiconductor device. Incidentally, since the top surface of the core domain of the semiconductor memory of this invention is flush with that of the peripheral circuits, there is no difficulty in producing the core domain of the semiconductor memory cell and the domain of the peripheral circuits concurrently in one step.

Referring to FIGS. 34 through 41, a method for producing a semiconductor memory cell of the one transistor and one capacitor structure in accordance with the third embodiment of this invention will be described below.

Referring to FIG. 34, a photolithography process is employed to produce a recessed groove in a p-Si substrate 1110 at a location where an element separation area is produced. A CVD process is employed to bury silicon dioxide selectively in the recessed groove, to produce an element separation area 1101.

Referring to FIG. 35, field effect transistors are produced on the Si substrate 1100. The surface of the p-Si substrate 1100 is oxidized to produce a silicon dioxide layer 1106 which acts as a gate insulator layer. A CVD process is employed to produce a conductive poly crystalline Si layer 1107 which acts as a gate electrode and a word line. A silicon dioxide layer 1120 is produced on the conductive poly crystalline layer 1107 by employing a CVD process. The silicon dioxide layer 1120, the conductive poly crystalline Si layer 1107 and the silicon dioxide layer 1106 are patterned into the horizontal shape of the gate electrode, which extends in a direction perpendicular to the page of the drawing, so that the gate electrode 1107 is allowed to act also as a word line. A CVD process is employed to produce a silicon dioxide layer 1108 which covers the gate electrode 1107 covered by the silicon dioxide layer 1108 and the p-Si substrate 700. The silicon dioxide layer 1108 is etched back to remain exclusively on the sides of the gate electrode 1107 as side walls. Using the gate electrode 1107 as a mask, an ion implantation process is conducted to introduce an n-impurity in the surface region of the p-Si substrate 1100 to produce a drain 1103 and a source 1104. A reduced pressure CVD process is employed to produce a silicon nitride layer 1121 on the entire surface of the substrate 1100. The silicon nitride layer 1121 is scheduled to be employed as an etching stop layer during a process for producing a contact hole 1113 to be conducted later.

A CVD process is employed to produce a BPSG layer 1109. After a bit contact 1111 (See FIG. 32) which contacts the source 1104, is produced, a bit line 1110 (See FIG. 32) is produced in a direction perpendicular to the word line 1107 (See FIG. 32) or along the surface of the page of the drawing from side to side. A CVD process is employed to produce a BPSG layer 1112 to insulate the bit line 1110.

Referring to FIG. 36, a photolithography process is employed to produce an opening or a contact hole 1113 to penetrate BPSG layers 1112 and 1109 to reach the silicon nitride layer 1121. A wet etching process conducted by employing an etchant containing HF can be employed for the process. A wet etching process conducted by employing an etchant containing hot phosphoric acid is employed to remove the silicon nitride layer 1121 from the bottom of the contact hole 1113.

Referring to FIG. 37, a reduced pressure CVD process is employed to produce a silicon nitride layer 1301 along the internal surface of the contact hole 1113 and on the top surface of the BPSG layer 1112. The preferable minimum thickness of the silicon nitride layer 1301 is 50 nm, because this thickness determines the total thickness of two dielectric layers 1115 and a second electrode 1116 of a capacitor 1117 which is produced in the later process.

Referring to FIG. 38, an anisotropic etching process is employed to etch back the silicon nitride layer 1301 and to remove the silicon nitride layer 1301 from the top of the drain 1104, such that the silicon nitride layer 1301 remains exclusively along the side of the BPSG layers 1112 and 1109 or along the internal surface of the contact hole 1113.

Referring to FIG. 39, a CVD process is employed to deposit conductive poly crystalline Si in the contact hole 1113 and on the top surface of the BPSG layer 1112 to produce a conductive poly crystalline Si layer 1302. The CVD process can be conducted employing a mixed gas containing $SiH_4$ and $PH_3$ at the ratio of 6:1 under a pressure of 400 mTorr, maintaining the temperature of the substrate at 600° C. A preferred thickness of the conductive poly crystalline Si layer 1302 is less than a half of the shorter side of the contact hole 1113.

A reduced pressure CVD process is employed to produce a silicon nitride layer 1303 in the contact hole 1113 and on the top surface of the conductive poly crystalline Si layer 1302. The contact hole 1113 can be filled by the silicon nitride layer 1303.

Referring to FIG. 40, an anisotropic etching process is employed to etch back the silicon nitride layer 1303.

Referring to FIG. 41, an etching process conducted employing an etchant containing hot phosphoric acid is employed to remove the silicon nitride layers 1301 and 1303.

In this manner, a conductive cylinder 1114 is produced. The bottom of the conductive cylinder 1114 is electrically connected with the drain 1103.

Referring to FIG. 33, a CVD process is employed to produce a silicon nitride layer 1115 along the external, top and internal surfaces of the conductive cylinder 1114. The silicon nitride layer 1115 is produced also along the surface of the BPSG layers 1112 and 1109. The silicon nitride layer 1115 acts as the dielectric plate of the capacitor 1117. The CVD process which can be employed for this process is a reduced pressure CVD process to be conducted employing a mixed gas containing $SiCl_2H_2$ and $NH_3$ at the ratio of 1:3 under a pressure of 0.1–10 Torr, maintaining the temperature of the substrate at 700° C.

A CVD process is employed to deposit conductive poly crystalline Si in the space or slit remaining between the external surface of the conductive cylinder 1114 and the side of the BPSG layers 1112 and 1109 and along the internal surface of the conductive cylinder 1114 to produce the second electrode 1116 of the capacitor 1117. The conductive poly crystalline Si layer 1116 is allowed to entirely fill the internal space 1114a of the conductive cylinder 1114. The conductive poly crystalline Si layer 1116 extends to wirings connecting the second electrode 1116 with a low and fixed electric potential such as the ground level. A patterning process is applied to the conductive poly crystalline Si layer 1116 to shape it to the wiring 1119. The CVD process which can be employed for this process is a CVD process to be conducted employing a mixed gas containing $SiH_4$ and $PH_3$ at the ratio 6:1 under a pressure of 400 mTorr, maintaining the substrate temperature at 600° C.

Thereafter, the ordinary processes for passivation and for wirings are conducted.

The foregoing description has clarified that a semiconductor memory cell of the one transistor and one capacitor structure and which has smaller horizontal dimensions, has been successfully provided by the third embodiment of this invention.

It is noted that the capacity of the capacitor of this third embodiment of this invention is much larger than that of the first or second embodiment of this invention, because not only the external surface of the conductive cylinder 1114 but also the internal surface of the conductive cylinder 1114 is utilized as the facing surface of the capacitor 1117. Therefore, the semiconductor memory cell can readily enjoy advantages acquired by the technical improvement in the integration of semiconductor devices.

Further, it is noted that the foregoing method for producing a semiconductor memory cell is much simplified in comparison with the method for producing a semiconductor memory cell of the one transistor and one capacitor structure in which the capacitor is a combination of horizontal plates.

The foregoing description has clarified that a semiconductor device employable as a capacitor of which the horizontal dimension is small, a method for producing the semiconductor device employable as a capacitor, three independent structures of semiconductor memory cells of the one transistor and one capacitor structure having smaller horizontal dimensions and methods for each of the foregoing semiconductor memory cells, have been successfully provide by this invention.

Although this invention has been described with reference to specific embodiments, this description is not meant to be construed in a limiting sense. Various modifications of the disclosed embodiments, as well as other embodiments of this invention, will be apparent to persons skilled in the art upon reference to the description of this invention. It is therefore contemplated that the appended claims will cover any such modifications or embodiments as fall within the true scope of this invention.

What is claimed is:

1. A semiconductor device employable as a capacitor, comparing:
    a semiconductor substrate having a top surface, wherein a conductive region is formed along the top surface;
    a first insulting layer formed on the semiconductor substrate, wherein the first insulting layer has a top surface and an opening above the conductive region such that the conductive region is exposed through the opening;
    a conductive pillar disposed within opening and in electrical contact with the conductive region such that a first surface of the conductive region is covered by the conductive pillar and a second surface of the conductive region is not covered by the conductive pillar, wherein the conductive pillar has a top surface and side surfaces;
    a second insulating layer covering the top surface of the conductive pillar, the side surfaces of the conductive pillar, and the second surface of the conductive region; and
    a conductive layer covering the second insulating layer and the top surface of the first insulating layer;
    whereby a capacitor is formed such that the conductive pillar is a first capacitor electrode, the second insulating layer is a capacitor dielectric, and the conductive layer is a second capacitor electrode.

2. A semiconductor memory cell having a structure including one transistor and one capacitor, the memory cell comprising:
    a field effect transistor, which includes a gate acting as a word line for the memory cell, a source for connection with a bit line of the memory cell that extends in a direction perpendicular to the word line, and a drain;
    a first insulating layer covering the field effect transistor, wherein the first insulating layer has a top surface and an opening above the drain such that the drain is exposed through the opening;
    a conductive pillar disposed within the opening and in electrical contact with the drain such that a first surface of the drain is covered by the conductive pillar and a second surface of the drain is not covered by the conductive pillar, wherein the conductive pillar has a top surface and side surfaces and forms a first electrode of a capacitor;
    a second insulating layer covering the top surface of the conductive pillar, the side surfaces of the conductive pillar, and the second surface of the drain, the second insulating layer forming a dielectric of the capacitor; and
    a conductive layer covering the second insulating layer and the top surface of the first insulating layer, for connection with a fixed electrical potential, the conductive layer forming a second terminal of the capacitor.

3. A semiconductor memory cell formed adjacent at least another semiconductor memory cell, having a structure including one transistor and one capacitor, the semiconductor memory cell comprising:
    a field effect transistor, which includes
        a gate acting as a word line for the memory cell,
        a source, adjacent and to a first side of the gate, for connection with a bit line of the memory cell that extends in a direction perpendicular to the word line, and
        a drain, adjacent and to a second side of the gate;
    a first insulating layer covering the field effect transistor, wherein the first insulating layer has a top surface and an opening above the drain such that the drain is exposed through the opening, the opening extending on a first side of the drain to about a center of the gate and on a second side of the drain to about a center of a gate of an adjacent semiconductor memory cell;
    a conductive pillar disposed within the opening and in electrical contact only with the drain, wherein the conductive pillar has a top surface and side surfaces and forms a first electrode of a capacitor;
    a second insulating layer covering the top surface of the conductive pillar and the side surfaces of the conductive pillar, the second insulating layer forming a dielectric of the capacitor; and
    a conductive layer covering the second insulating layer and the top surface of the first insulating layer, for connection with a fixed electrical potential, the conductive layer forming a second terminal of the capacitor.

4. A semiconductor memory cell formed adjacent at least another semiconductor memory cell, having a structure including one transistor and one capacitor, the semiconductor memory cell comprising:
    a field effect transistor, which includes
        a gate acting as a word line for the memory cell,
        a source, adjacent and to a first side of the gate, for connection with a bit line of the memory cell that extends in a direction perpendicular to the word line, and
        a drain, adjacent and to a second side of the gate;
    a first insulating layer covering the field effect transistor, wherein the first insulating layer has a top surface and an opening above the drain such that the drain is exposed through the opening, the opening extending on a first side of the drain to about a center of the gate and on a second side of the drain to about a center of a gate of an adjacent semiconductor memory cell;
    a hollow conductive cylinder disposed within the opening and in electrical contact only with the drain, wherein the conductive pillar has a closed bottom end and an open top end, a top surface, an external surface, and an internal surface, wherein the conductive cylinder forms a first electrode of a capacitor;
    a second insulating layer covering the top surface, the external surface, and the internal surface of the conductive cylinder, the second insulating layer forming a dielectric of the capacitor; and
    a conductive layer covering the second insulating layer and the top surface of the first insulating layer, for connection with a fixed electrical potential, the conductive layer forming a second terminal of the capacitor.

* * * * *